(12) United States Patent
Tuan et al.

(10) Patent No.: US 6,311,147 B1
(45) Date of Patent: *Oct. 30, 2001

(54) INTEGRATED CIRCUIT POWER NET ANALYSIS

(75) Inventors: Jeh-Fu Tuan, San Jose; Peiqi He, Santa Clara, both of CA (US)

(73) Assignee: Synopsys, Inc., Mountain View, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/072,512

(22) Filed: May 4, 1998

Related U.S. Application Data

(63) Continuation of application No. 08/424,876, filed on Apr. 17, 1995, now Pat. No. 5,872,952.

(51) Int. Cl.[7] ............................................. G06F 17/50
(52) U.S. Cl. ................................. 703/18; 703/19; 716/5; 716/6
(58) Field of Search ..................... 395/500, 183.13, 395/183.16; 364/578, 489, 490; 371/22.1, 22.5, 22.6, 25.1; 703/14, 18, 19; 716/6, 10, 12, 5

(56) References Cited

U.S. PATENT DOCUMENTS

| | | | |
|---|---|---|---|
| 4,744,084 * | 5/1988 | Beck et al. ................. | 371/23 |
| 4,907,180 | 3/1990 | Smith ......................... | 364/578 |
| 4,974,173 | 11/1990 | Stefik et al. ................ | 395/153 |
| 5,119,312 | 6/1992 | Groger et al. .............. | 364/483 |
| 5,325,309 * | 6/1994 | Halaviati et al. ........... | 364/488 |
| 5,473,548 | 12/1995 | Omori et al. ............... | 364/489 |
| 5,481,469 | 1/1996 | Brasen et al. .............. | 364/483 |
| 5,521,834 | 5/1996 | Crafts et al. ............... | 364/489 |
| 5,535,370 | 7/1996 | Raman et al. .............. | 395/500 |
| 5,553,008 * | 9/1996 | Huang et al. ............... | 364/578 |
| 5,559,715 | 9/1996 | Misheloff .................... | 364/488 |
| 5,598,348 * | 1/1997 | Rusu et al. ................. | 364/491 |
| 5,612,636 | 3/1997 | Ko .............................. | 326/83 |
| 5,648,910 * | 7/1997 | Ito ............................... | 364/490 |
| 5,706,477 * | 1/1998 | Goto ........................... | 395/500 |
| 5,768,145 * | 6/1998 | Roethig ...................... | 364/488 |
| 5,794,008 * | 8/1998 | Meyers et al. ............. | 395/500 |
| 5,872,053 * | 3/1999 | Koh et al. ................... | 371/22.1 |
| 5,878,952 * | 2/1999 | Tuan et al. .................. | 395/500 |
| 5,933,358 * | 8/1999 | Koh et al. ................... | 364/578 |

* cited by examiner

Primary Examiner—Kevin J. Teska
Assistant Examiner—Thai Phan
(74) Attorney, Agent, or Firm—Townsend and Townsend and Crew LLP

(57) ABSTRACT

A method for power net analysis of integrated circuits is provided. A circuit simulator determines current values for integrated circuit devices at specified supply voltages. A power net simulator uses the current values to calculate characteristics of the power net. The characteristics include voltage drop, current density and ground bounce. A layout representation of the power net is shown on a computer display along with the user-specified characteristics.

20 Claims, 20 Drawing Sheets

Segment

INTEGRATED CIRCUIT POWER NET ANALYSIS

CROSS-REFERENCE TO RELATED APPLICATION

This application is a continuation of and claims the benefit of U.S. patent application Ser. No. 08/424,876, filed Apr. 17, 1995, Pat. No. 5,872,952 the disclosure of which, including its Appendix of source code listings, is hereby incorporated by reference in its entirety for all purposes.

A portion of the disclosure of this patent document contains material which is subject to copyright protection. The copyright owner has no objection to the xerographic reproduction by anyone of the patent document or the patent disclosure in exactly the form it appears in the Patent and Trademark Office patent file or records, but otherwise reserves all copyright rights whatsoever.

APPENDIX

An Appendix of source code listings of an embodiment of the invention comprising forty-four (44) sheets is included herewith.

BACKGROUND OF THE INVENTION

The present invention relates to computer-aided design (CAD) tools for analyzing integrated circuits and, more particularly, to analyzing power Vdd and ground nets in integrated circuits for electromigration, voltage drop and ground bounce.

Aggressive development within the semiconductor industry keeps electronic products moving on a brisk course forward. With each new generation of integrated circuit (IC) chips, device geometries and supply voltages are decreasing while the clock frequencies are increasing. Typical ICs today contain more than three million transistors and include three to five layers of metal interconnects that supply power and transport signals.

Along with smaller device geometries come narrower metal lines and larger resistances. Also, as more devices are interconnected, the lines are getting longer, further increasing the interconnect resistance. The substantial voltage drops that develop across metal power nets cause the circuits to malfunction, especially when the supply voltage is reduced below 3 volts. For example, a 1 volt drop in a 3 volt system would have a much more severe impact on circuit functionality than a proportional drop in a 5 volt system. So, in deep submicrometer designs (feature sizes less than 0.5 $\mu M$), voltage drop analysis is crucial. Additionally, the narrower metal lines have undesirable wear-out of metal wiring caused by electromigration.

Ground bounce is due to the inductance in the IC package pins and bonding wires and the current switching (dI/dt) in the integrated circuit. Ground bounce noise may affect circuits in various ways. For example, ground bounce noise may degrade the performance of the circuit. Additionally, ground bounce noise may cause the circuit to malfunction due false latching in receiving chips.

In deep submicron design, the circuit consumes more power which means that dI/dt is even greater than in nonsubmicron designs. The ground bounce problem in the past was more significant in output buffers than on-chip circuits. However, the ground bounce noise in on-chip circuits is becoming more important with today's technologies.

Numerous CAD tools exist for simulating transistor networks of ICs (e.g., SPICE). An innovative system is described in U.S. patent application Ser. No. 08/040,531, entitled "Transistor-Level Timing and Power Simulator and Power Analyzer", filed Mar. 29, 1993 by Huang et al., and U.S. patent application Ser. No. 08/231,207, entitled "Power Diagnosis for VLSI Designs", filed Apr. 21, 1994 by An-Chang Deng, which are both hereby incorporated by reference for all purposes. However, none of the prior art systems allow the user to simulate the power nets of an IC and display power net characteristics like voltage drop, current density and ground bounce. The present invention fulfills this and other needs.

SUMMARY OF THE INVENTION

The present invention provides methods for analysis of power nets of integrated circuits. In a preferred embodiment, a system of the present invention includes a transistor network simulator and a power net simulator. The transistor network simulator calculates current information of the transistor network at specified supply voltages. The power net simulator uses the currents calculated in the transistor network simulation to calculate node voltages and branch currents in the power net. The node voltages and branch currents are used for checking voltage drops, current densities and ground bounce. Peak voltage drops are checked against user-specified thresholds. The present invention gives designers a quick way of identifying problem areas in their IC design.

In one aspect of the present invention, a method of analyzing power nets on a computer system comprises the steps of: inputting an integrated circuit layout and netlist of an integrated circuit, the integrated circuit including integrated circuit devices; with the circuit netlist, simulating operation of the integrated circuit to a series of logical input vectors at specified supply voltages; extracting a power net netlist from the circuit layout, the power net netlist including at least one power pad and at least one integrated circuit device connection; determining current at selected integrated circuit devices electrically connected to a power net specified by the power net netlist; with the power net netlist, simulating operation of the power net according to current at the selected integrated circuit devices to determine a characteristic of portions of the power net; displaying a layout representation of the power net on a display of the computer system; and displaying the characteristic of the portions of the power net on the layout representation.

Other features and advantages of the present invention will become apparent upon a perusal of the remaining portions of the specification and drawings. In the drawings, like reference numerals indicate identical or functionally similar elements.

DESCRIPTION OF THE PREFERRED EMBODIMENT

General Description of the System

The present invention provides methods for analysis of power nets integrated circuits. In a preferred embodiment, the power net simulation engine of the present invention operates in conjunction with a transistor network (i.e., circuit) circuit simulation engine. However, the following description of a preferred embodiment is for illustrative purposes. The present invention is not limited to the specific structure or methods described.

Figure 1:
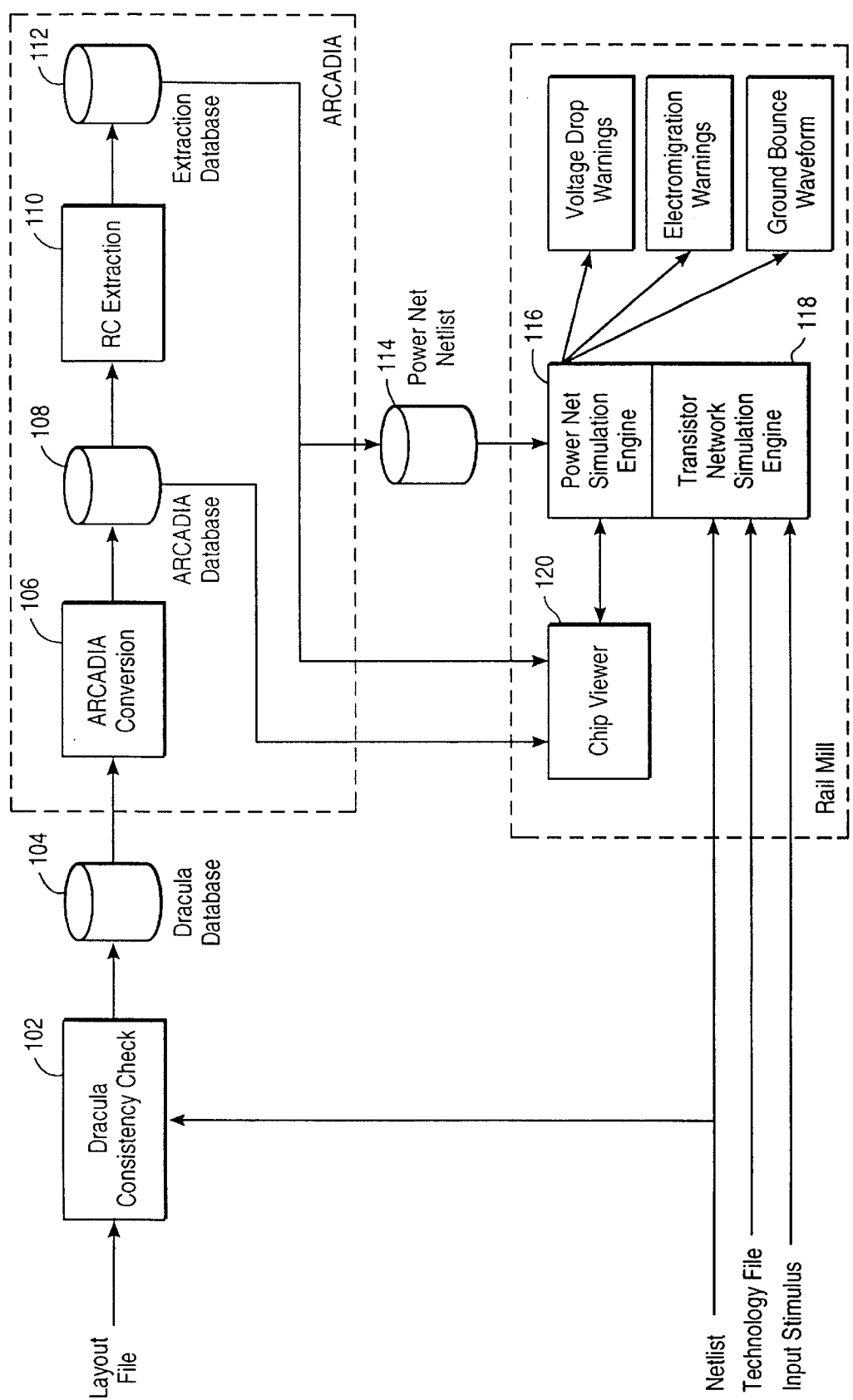
FIG. 1 is a data flow diagram of a system employing a preferred embodiment of the present invention.

FIG. 1 is a data flow diagram of a system employing a preferred embodiment of the present invention. The present invention will be briefly described in reference to FIG. 1 with more detailed description following. The system receives as input various computer readable files. The layout file contains the layout of the integrated circuit under test in a database format.

The netlist file defines the circuit to be simulated and is constructed from circuit elements connected by input and output nodes to form a network. A circuit element can be a single transistor, resistor, capacitor, gate, register, functional model, and the like. For simplicity, the circuit network will also be identified as a transistor network. The wire connections between elements are referred to as "nets." Therefore, the wire connections between the power Vdd or ground pads to elements shall be referred to as power nets.

The technology file is a data file containing user-specified MOS parameters and SPICE generated characteristics (i.e., Vgs, Vds v. Ids). The input stimulus file contains input data used to stimulate the simulated circuit. The data or stimuli contained in the input stimulus file may be in a variety of formats, including conventional test vectors, simulated clock input, constant period vector stimulus specification (stimulus signals to be applied at fixed time intervals) and logical one and zero constants.

A DRACULA® consistency check 102 is performed on the layout file and the netlist file. The DRACULA® integrated circuit (IC) layout verification system is a complete set of integrated capabilities for verifying IC layout designs and is available from Cadence Design Systems, Inc., 555 River Oaks Parkway, San Jose, Calif. 95134. The consistency check may be a layout versus schematic (LVS) consistency check which compares the IC layout to the circuit schematics and reports discrepancies in the layout interconnections. Additionally, the consistency check may be a layout parameter extraction (LPE) which computes and extracts key electrical parameters from the IC layout and uses the extracted parameters in layout-to-schematic consistency checking. After the consistency check, the circuit is stored in a DRACULA® database 104.

An ARCADIA conversion 106 converts the DRACULA® database to an ARCADIA database 108. The ARCADIA system is an interactive CAD tool available from Archer Systems, Inc., 4633 Old Ironsides Drive, Suite 240, Santa Clara, Calif. 95054. The ARCADIA system is used to perform an RC extraction 110 which extracts active transistor sizes from the DRACULA database, electrical parameters for the interconnect delay, and computes 2D/3D parasitic coupling effects between the same and different layers of interconnect. The RC extraction produces an extraction database 112. The ARCADIA system is also used to extract a power net netlist 114 from the extraction database. The ARCADIA User Manual, Version 1.1., February 1995 available from Archer Systems, Inc. is hereby incorporated by reference for all purposes.

The present invention may be utilized with other power net netlist extractors including power net netlist extractors available from Integrated Silicon Systems, Inc., 2222 Chapel Hill-Nelson Highway, Durham, N.C. 277713 and Mentor Graphics Corp., 8005 S.W. Boeckman Road, Wilsonville, Oreg. 97070. When the present invention is utilized with other power net netlist extractors, the use of the DRACULA system may become unnecessary depending on whether the specific power net netlist extractor utilizes a DRACULA database as input as in the ARCADIA system.

The power net netlist is input for the power net simulation engine 116 of the present invention. The power net simulation engine operates with a transistor network simulation engine 118. The transistor network simulation engine is based on the PowerMill simulation product from EPIC Design Technology, Inc., 2901 Tasman Drive, Suite 212, Santa Clara, Calif. 95054. A description of the PowerMill simulation product is contained in the U.S. patent application Ser. No. 08/040,531, previously incorporated by reference.

The transistor network simulation engine simulates the circuit operation according to the input stimulus file and specified power supply voltages. The transistor network simulation engine generates the current drawn by the circuit devices, including the circuit devices connected to the power net. The transistor network simulation may utilize constant power supply voltages or the power supply voltages calculated by the power net simulation. The power net simulation engine uses the current information to calculate the voltage drop and current in the branches of the power net. The power net simulation engine generates voltage drop, electromigration and ground bounce warnings during simulation.

A ChipViewer product 120 displays a layout of the power net and shows voltage drop and current density on the power net. The ChipViewer product displays the different values for voltage drop and current density in different colors on the layout to allow the user to quickly identify areas of interest. Additionally, the ChipViewer product allows the user to zoom in on specific areas of the power net or query to determine specific values.

Figure 2:
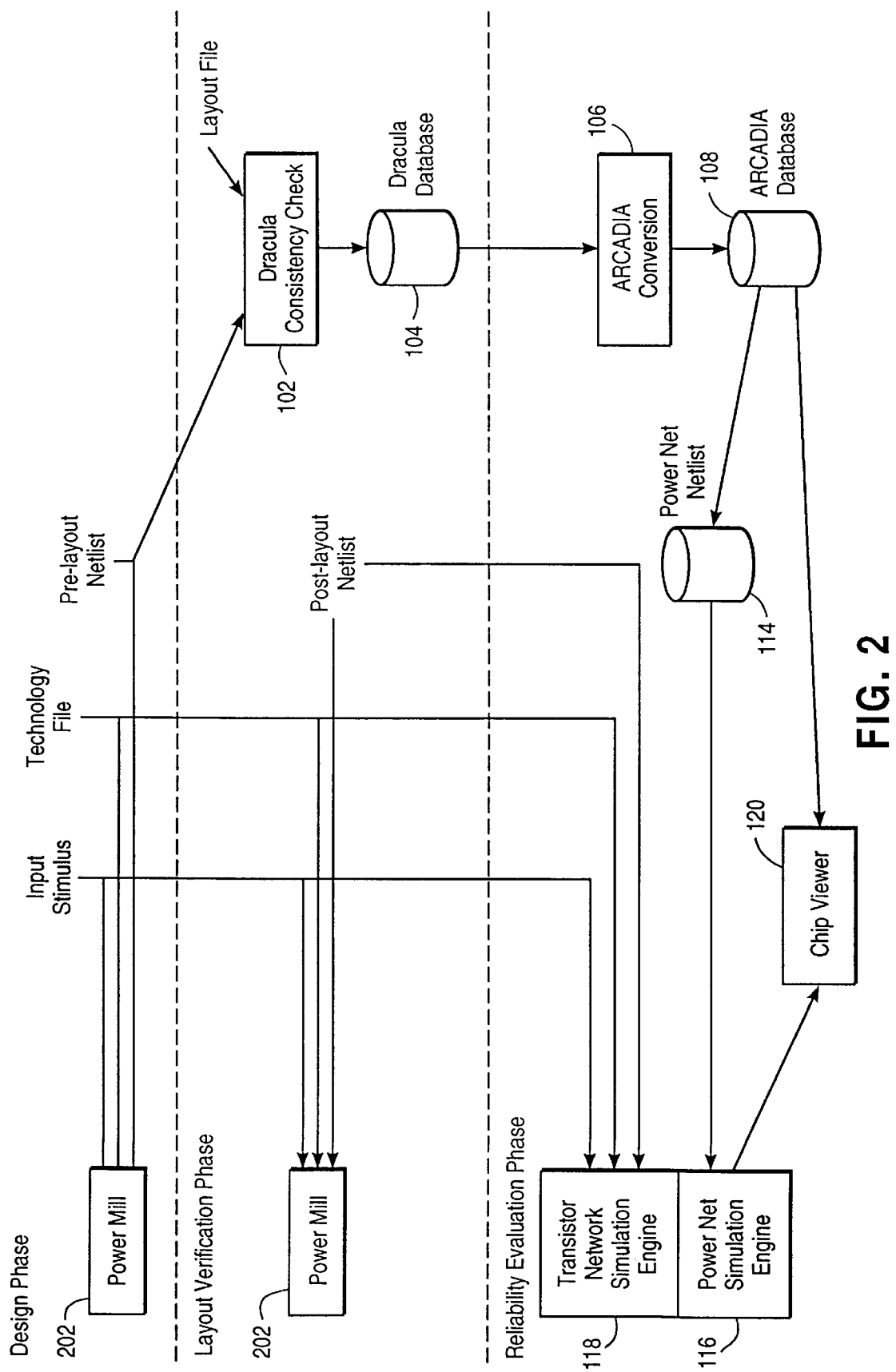
FIG. 2 shows a design flow of a system employing a preferred embodiment of the present invention.

FIG. 2 shows a design flow of a system employing a preferred embodiment of the present invention. Three different phases are shown: the design phase, the layout verification phase, and the reliability evaluation phase.

In a design phase, the pre-layout circuit netlist is used for a PowerMill simulation. Wire loading is estimated by circuit fanout because the actual layout has not been determined. Stimuli are utilized to verify circuit functionality and timing in the design phase.

In a layout verification phase, the circuit layout is verified against the pre-layout circuit netlist. Wire loading is extracted by a circuit extractor and utilized in a PowerMill simulation. The same stimuli used in the design phase is utilized in the layout verification phase to verify circuit functionality and timing.

The circuit netlist and stimuli used in the layout verification phase are utilized in the reliability evaluation phase. The power net is extracted from the circuit layout. Reliability analysis are performed and the simulation results are checked against user-specified thresholds.

A preferred embodiment of the present invention is written using the "C" language, and runs on UNIX™-based engineering workstations such as a Sun workstation. Supporting an X Window environment and conforming to the ANSI standard on the "C" language, it can be readily rehosted to any UNIX-based computers with a standard "C" compiler.

Figure 3:
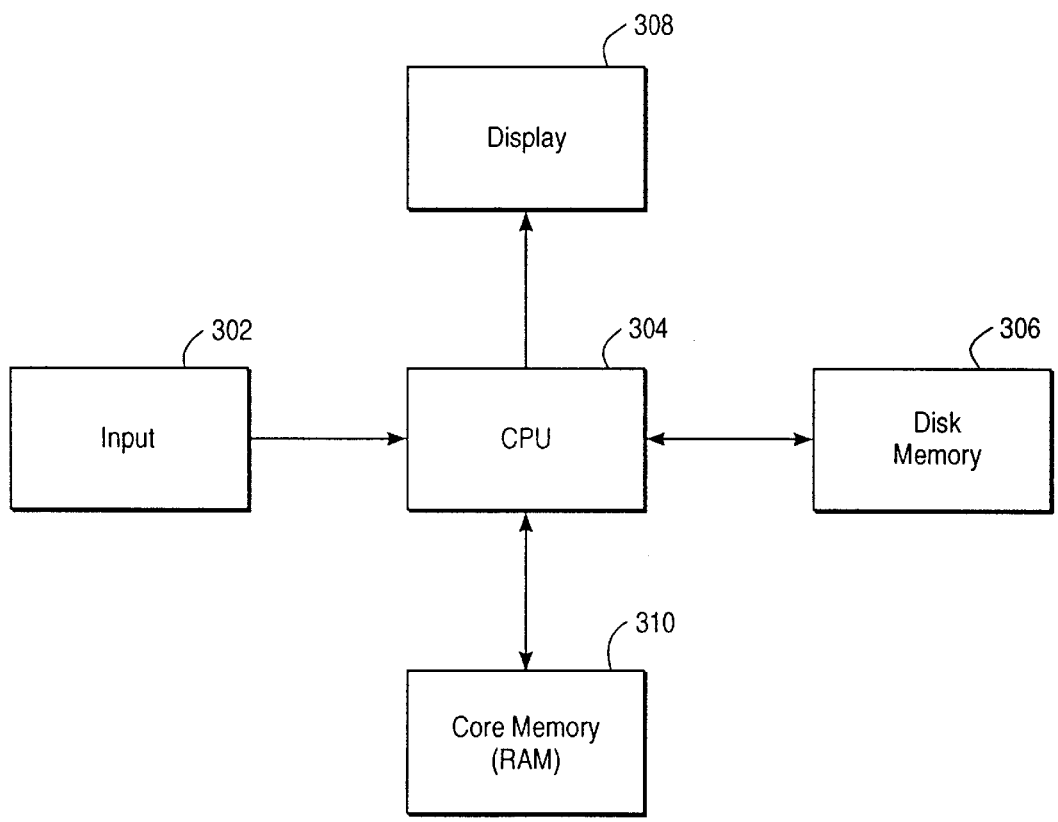
FIG. 3 is a block diagram showing the computer architecture used to support a preferred embodiment of the present invention.

FIG. 3 is a block diagram showing the computer architecture used to support a preferred embodiment of the present invention. A user input 302 includes a computer keyboard and/or mouse for inputting various instructions and data to a CPU 304. A disk memory 306 holds a variety of files (including netlists, stimulus, technology, and configuration) as well as simulator executable binary code. A display 308 typically includes a computer monitor for showing the output data to a user. A core memory 310 is fast access memory used by the CPU during processing.

CPU 304 interconnects user input 302, display 308, disk memory 306, and core memory 310. During startup, CPU 304 accesses disk memory 306 and loads necessary files and code to core memory 310 for access during simulation. Processed data may be output to disk memory 306, display 308, or a printer (not shown) connected to the CPU.

Operation of the Power Net Simulator

Figure 4:
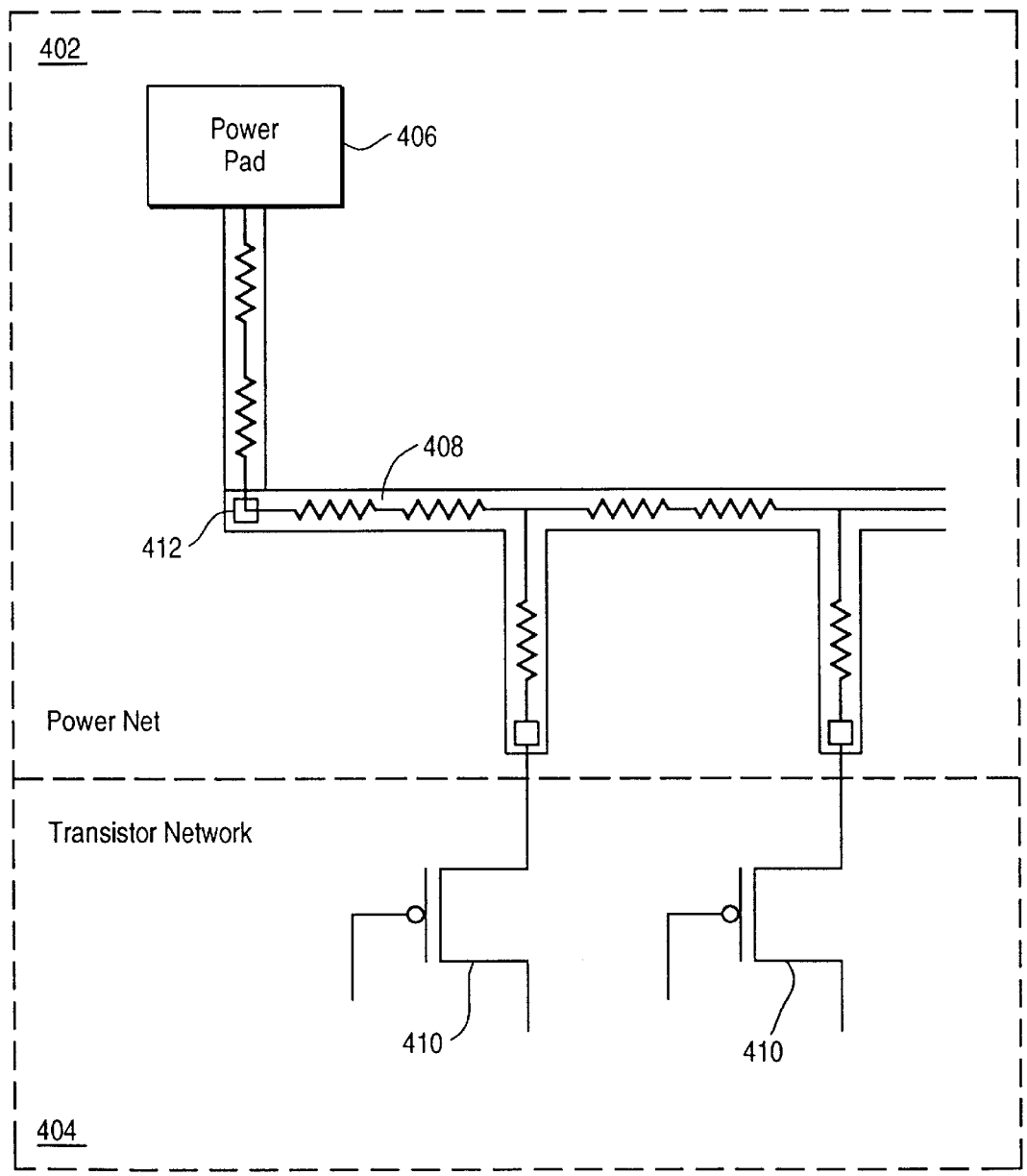
FIG. 4 illustrates a power net and a transistor network of an integrated circuit.

A power net is composed of the metal lines and contacts (vias) that connect power pads to electronic devices in the IC. FIG. 4 illustrates a power net 402 and a transistor network 404 of an integrated circuit. The power net shown includes a power pad 406 and metal lines 408. The metal lines electrically connect the power pad to transistors 410 in the transistor network. Because power pad 406 may be located in a different layer than the transistors, an interconnect via 412 connects metal lines from one layer to metal lines in another layer. An integrated circuit is composed of a power Vdd net and a power ground net. As shown, the metal lines in the power net typically act as small resistors that lower the voltage applied to the transistor network. Although a single power pad is shown, an IC may contain numerous power pads.

Figure 5A:
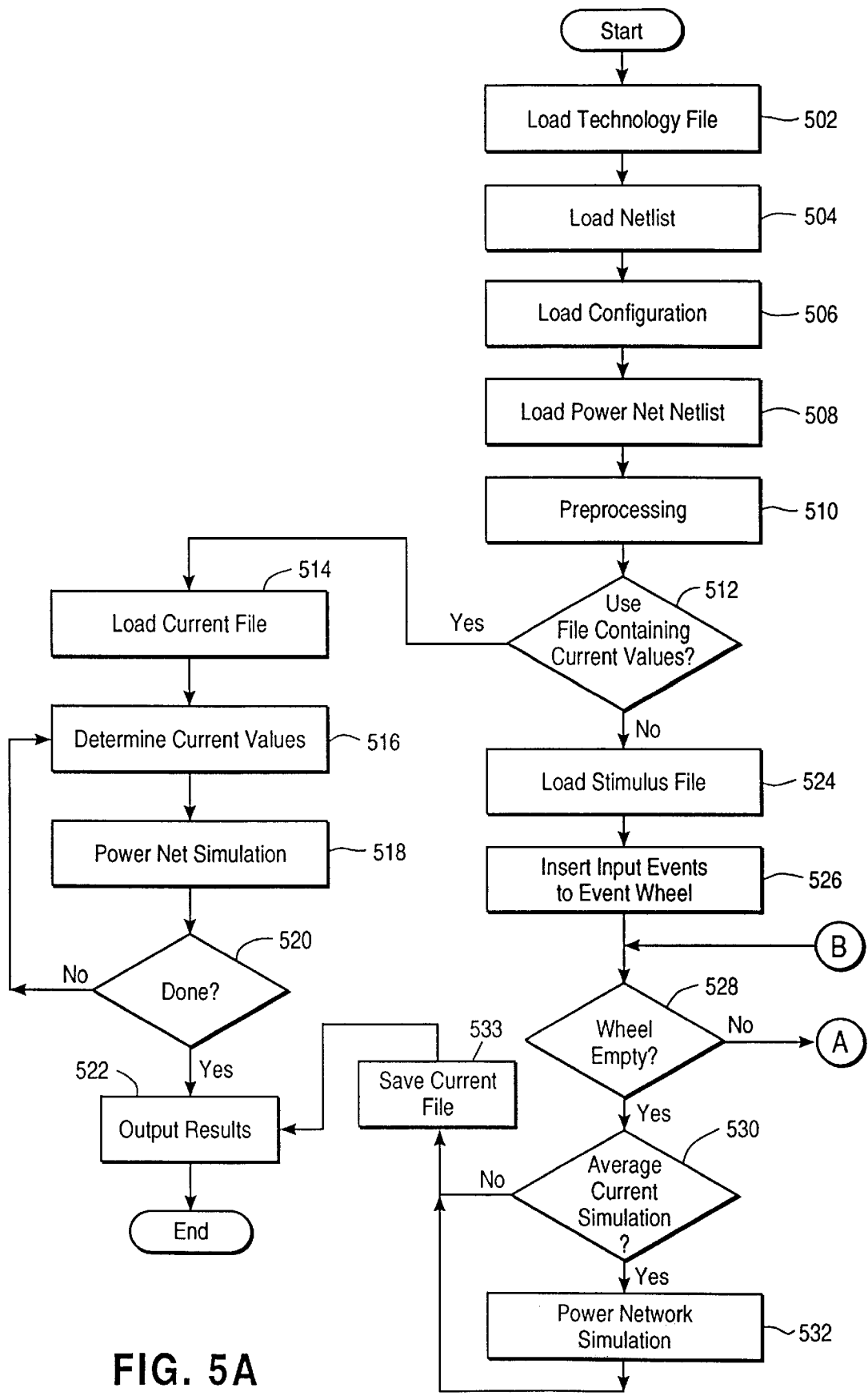
FIGS. 5a and 5b are a flowchart of the top-level process of one embodiment of a simulator incorporating the present invention.
Figure 5B:
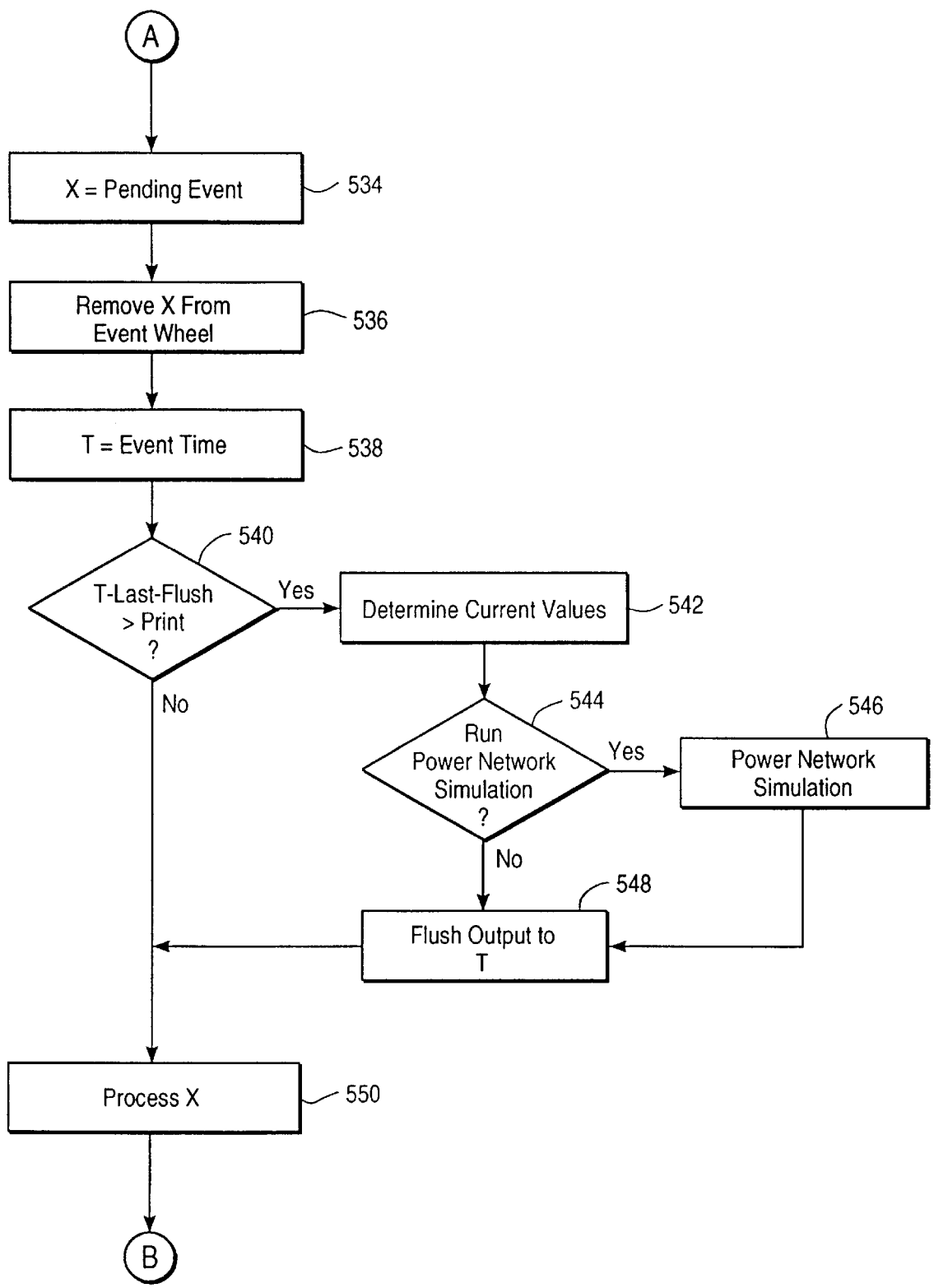

FIGS. 5A and 5B are a flowchart of the top-level process of one embodiment of a simulator incorporating the present invention. At step 502, a technology file is loaded into RAM of the computer system. A netlist of the circuit is loaded into RAM in step 504. A configuration file containing information used to configure the power net simulator and transistor network simulator is loaded into RAM at step 506. The configuration file specifies values to be used during simulation other than the default values.

At step 508, the power net netlist is loaded into memory. The process of loading the power net netlist will be discussed in more detail in reference to FIG. 8. Preprocessing is performed at step 510. During preprocessing, the power net simulator and transistor network simulator access the netlist and create data structures to aid in simulation.

Although the power net simulator may be run in conjunction with the transistor network simulator, the power net simulator may also be run independent of the transistor network simulator. When run independently, the transistor network simulator produces a file containing current values for the circuit. At step 512, the user is asked whether a file containing current values previously generated by the transistor network simulator should be used for the power net simulator. If the file containing current values is to be used, the current file is loaded into memory at step 514.

Figure 6A:
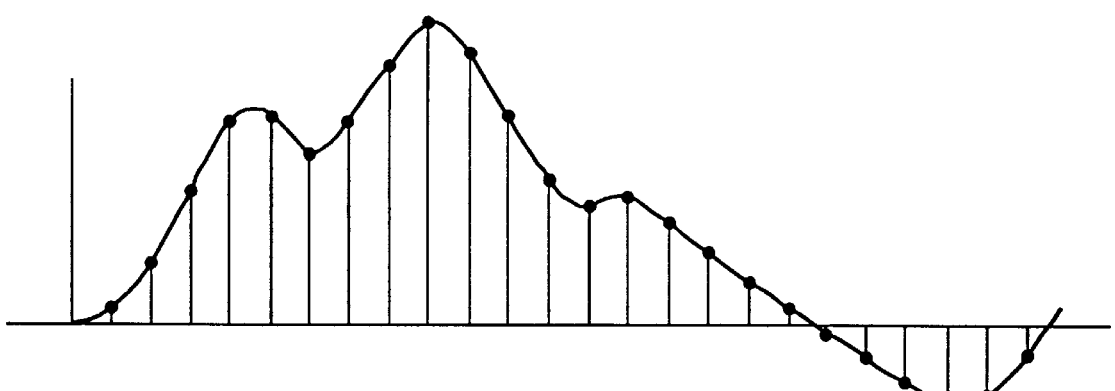
FIGS. 6a, 6b and 6c show the different current values used by the power net simulator.
Figure 6B:
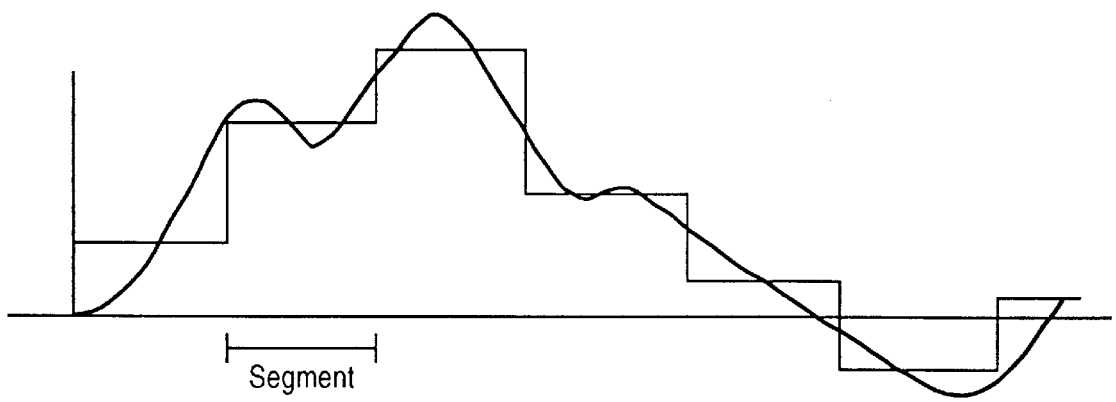
Figure 6C:
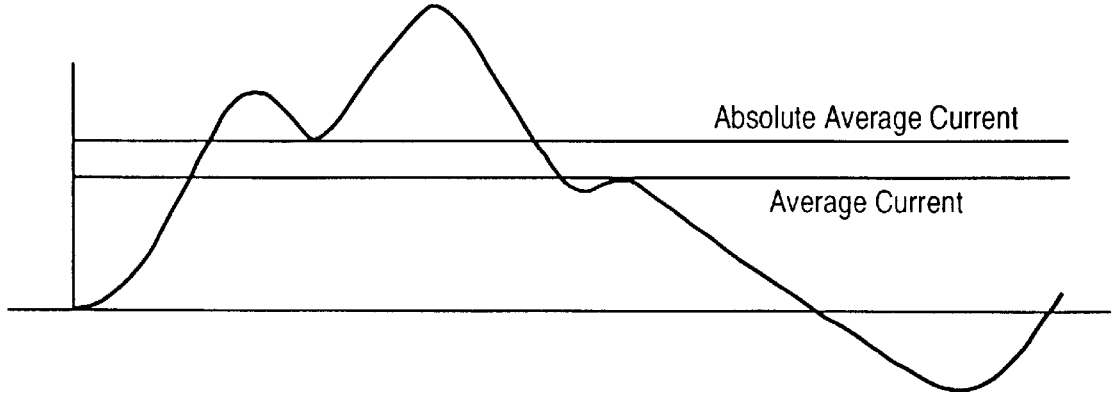

The power net simulator of the present invention is capable of utilizing three different current values during simulation. FIGS. 6A, 6B, and 6C show the different current values used by the power net simulator. Instantaneous current values are illustrated in FIG. 6A. Simulation based on the instantaneous current values will be very accurate because it uses the current at small increments of time. Simulation based on instantaneous current values is typically used for ground bounce and detailed voltage drop analysis.

Segment average current values are illustrated in FIG. 6B. A segment average current value is an average current for each time segment (for example, every 5 ns). Simulation based on the segment average current value provides good accuracy and more efficient simulation speed. Typically, segment average current values are used for electromigration and voltage drop analysis.

Average current values are illustrated in FIG. 6C. An average current value is the average current for the total transistor network simulation. Absolute average current is the average absolute value of the current for the total transistor network simulation. Power net simulation based on average current is very fast and typically used for electromigration analysis.

Referring again to FIG. 5A, the current values at the electronic devices of the circuit connected to the power net are determined at step 516. The power net simulation is then performed at step 518. The process of the power net simulation is described in more detail in reference to FIG. 9.

At step 520, the computer system checks to see whether another power net simulation should be performed. For example, if the configuration file specifies that average current values will be used in the power net simulation, then the power net simulation will only be performed once using the average current values. However, if the configuration file specifies that instantaneous current values should be used, the power net simulation will be performed for different sets of current values in the current file. The user can also input both average and instantaneous vector values each incremental time value (e.g., see FIG. 6a). After the power net simulation has been performed, the results are output at step 522. The results are typically displayed on a computer display for the user to view. The display process is described in more detail in reference to FIGS. 14–18.

If the user chooses not to use a file containing current values, a stimulus file is loaded into memory in step 524. In addition to test vectors, this file contains initialization vectors to set the simulated circuit to a predefined state prior to the beginning of actual simulation.

In a preferred embodiment, timing in the transistor network simulator is "event driven." Events are defined as any node voltage changes at a future time that exceed a certain threshold, or "event resolution." The event resolution is a global constant defined by the user or simulator (i.e., as a default value) with a preferred value of 1/10 th the supply voltage (Vdd). Events are added to, and sometimes canceled from, a global data structure containing a list of events sorted by their time of occurrence. This data structure holds both external (i.e., input vectors) as well as internal events.

The particular data structure used in one embodiment is a folded array known as an "event wheel." Simulation proceeds by processing all events pending at the current simulation time and advancing the current time to the time step at which the nearest future event is pending. At step 526, "input events" are initially inserted into the event wheel of the simulator. These events are simply input vectors created to indicate the simulation, and begin generating internal events. The event wheel is checked for the presence of events at step 528. If none exist, the transistor network simulation is complete.

Once the transistor network simulation is complete, the power net simulation determines whether average current simulation is requested at step 530. If average current values are to be used, the power net simulation will be performed using the average current values at step 532. The process of power net simulation is discussed in more detail in reference to FIG. 9. Before the results are output at step 522, a file is saved containing current values for the circuit produced by the transistor network simulator at step 533.

If, at step 528, the event wheel is not empty, the system clock advances to the time of the next pending event which is retrieved as event "x" at step 534 in FIG. 5b. The event x is then removed from the event wheel at step 536.

Prior to processing event x, the transistor network simulator checks the event time to determine whether accumulated current and time data collected should be output. At step 538, the transistor network simulator sets variable T equal to the present event time. The transistor network simulator compares variable T with variables "PRINT" and "last_flush." PRINT is a user-defined quantity for determining the length of delay before flushing (i.e., outputting) data. Last_flush is a variable whose value is incremented each time data is output. If T has increased such that T minus last_flush is greater than PRINT at step 540, current values are determined at step 542.

At each time increment, the transistor network simulator calculates the instantaneous current value at each transistor location. The transistor network simulator may be configured to use constant power supply voltages or use power supply voltages calculated by the power net simulator. Feeding the power supply voltages from the power net simulator back into the transistor network simulator is more accurate but requires that the power net simulator be run more often. If the user has specified that the power net simulator will use segment average current values and the present event time corresponds to the end of a segment, the transistor network simulator calculates the average current for the segment.

At step 544, the transistor network simulator determines whether to run the power net simulator. The power net simulator will be run if the user has specified instantaneous current values. Otherwise, the power net simulator will be run if the user has specified segment average current values and the present event time corresponds to the end of a segment. If the power net simulator is to be run, power net simulation is performed at step 546. At step 548, current and time data is output up to time T.

After the data output determination is complete, event x is processed at step 550. After event processing for x is complete, the transistor network simulator scans the event wheel for the next pending event at step 528 in FIG. 5a.

Figure 7:
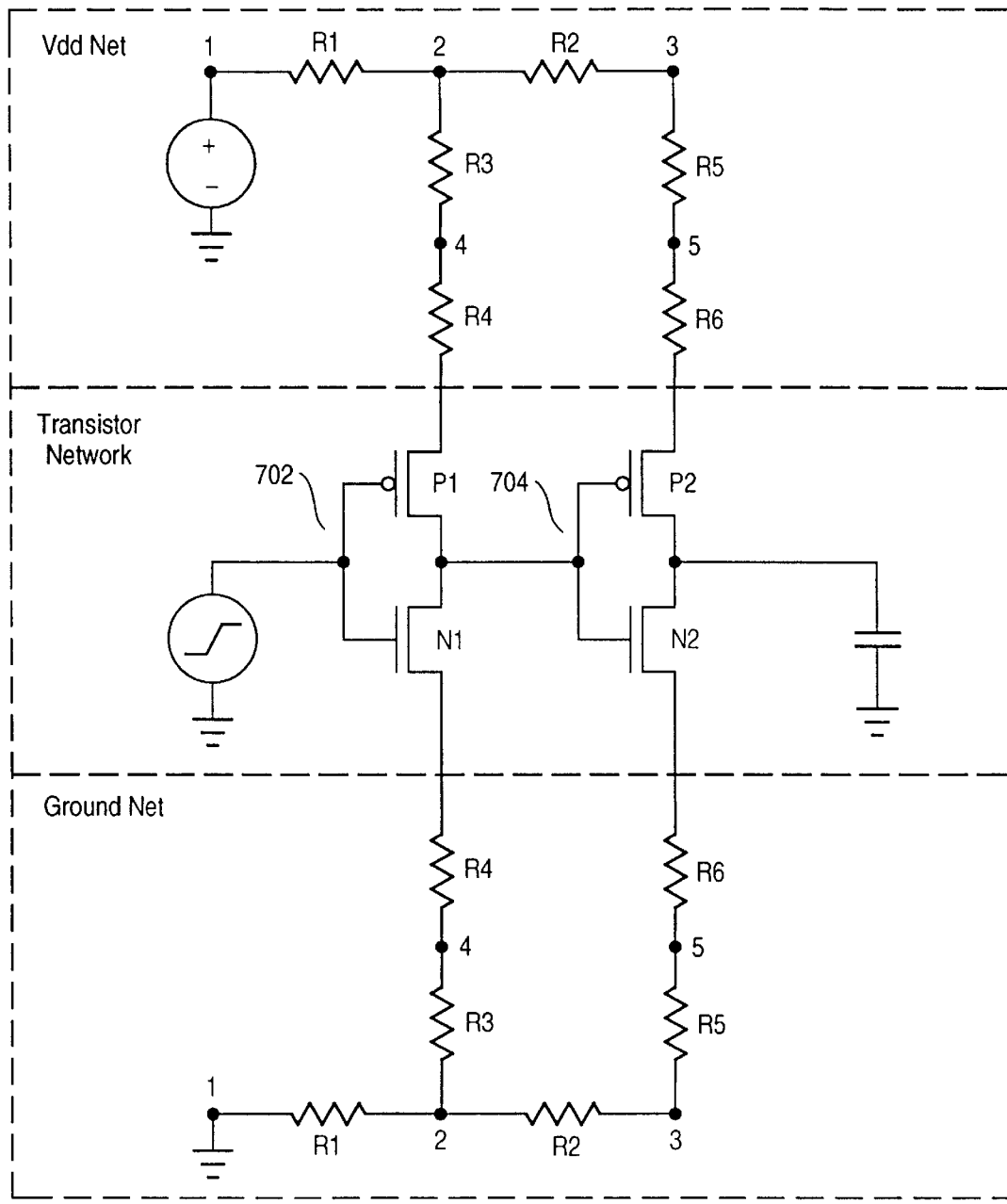
FIG. 7 is a schematic of a simple circuit and accompanying power nets.

Before describing how the power net netlists are loaded into memory, the contents of a file containing the power net netlist will be described. The power net netlist produced by the ARCADIA system are back annotated from separate netlists for power net simulation and all the information needed for power net simulation are included in the netlist. This approach has the benefit that the connectivity between transistors and power nets may be reconstructed from the netlists. FIG. 7 is a schematic of a simple circuit and accompanying power nets. As shown in FIG. 7, the transistor network is composed of two inverters 702 and 704. Inverter 702 includes a PMOS transistor P1 and an NMOS transistor N1. Similarly, inverter 704 is comprised of a PMOS transistor P2 and an NMOS N2. The power Vdd net is connected to the sources of PMOS transistors P1 and P2.

The following is an extracted power Vdd net for the circuit in FIG. 7:

```
*_ NET   VDD    VDD:1
R1    VDD:1    VDD:2      0.1   *_1200_1_10000_10000_1
R2    VDD:2    VDD:3      0.1   *1200_1_20000_10000_2
R3    VDD:2    VDD:4      0.5   *_800_2_10000_20000_3
R4    VDD:4    VDD:P1_S   0.1   *_1200_3_10000_30000_4
R5    VDD:3    VDD:5      0.5   *_800_2_20000_20000_5
R6    VDD:5    VDD:P2_S   0.1   *_1200_3_20000_30000_6
```

The first line of the netlist above describes the name of the power net as VDD (GND specifies the power ground net). The names following VDD are the names of the VDD pads, which connect to the positive power supply. Although a VDD power net may contain more than one VDD pad, one pad is shown for simplicity. GND and other signal nets would have a similar format. The netlist statements are SPICE compatible except for the phrases that begin with the notation "*_", which denote information specifically used for power net simulation.

The syntax for resistors is "R(name) Node1 Node2 resistance *_width_layer_X_Y_group." The units for width, X and Y, are in nM (1E-9 Meter), the unit for resistance is in Ohms. Thus, the first resistor in the netlist has element "R1", width 1.2 $\mu$M, layer number 1, X coordinate 10 $\mu$M, Y coordinate 10 $\mu$M, two terminal node names VDD:1 and VDD:2, and has resistance value of 0.1 Ohm. The group number is 1, which is primarily used for highlighting on the computer display. In a preferred embodiment, ARCADIA power net netlist extraction generates the group numbers which uniquely identify resistors in the power net. However, the resistors could also be identify by name (e.g., "R2") or by layer, x and y location. When other power net netlist extractors are utilized, an appropriate method of resistor identification should be chosen.

Although the power net netlists of the present invention contain more information than ordinary SPICE netlists, the connectivity between the power net and the transistor network of the circuit needs to be reconstructed. The link between a node in a power net and a transistor in the circuit is hidden in the name of the power net node and that information is used to reconstruct the connectivity. For example, resistor R4 above has a terminal node name VDD:P1_S which explicitly denotes that the resistor is connected to the source terminal of transistor P1 in the circuit. This element name can be either flat or hierarchical depending on whether the circuit netlist is flat or hierarchical. Preferably, each transistor connected to the power net must be connected to a unique node in the power net. Thus, there cannot be more than one transistor connected to the same node in the power net. If such a situation occurs, the layout extractor inserts a dummy resistor with zero resistance between the two transistors.

The syntax of an inductor is the same as a resistor except that it starts with an L to indicate an inductor and the unit of the inductor's value is H (Henry). The syntax of a capacitor allows only node to ground connections and the unit of the capacitor is F (Farad).

Figure 8:
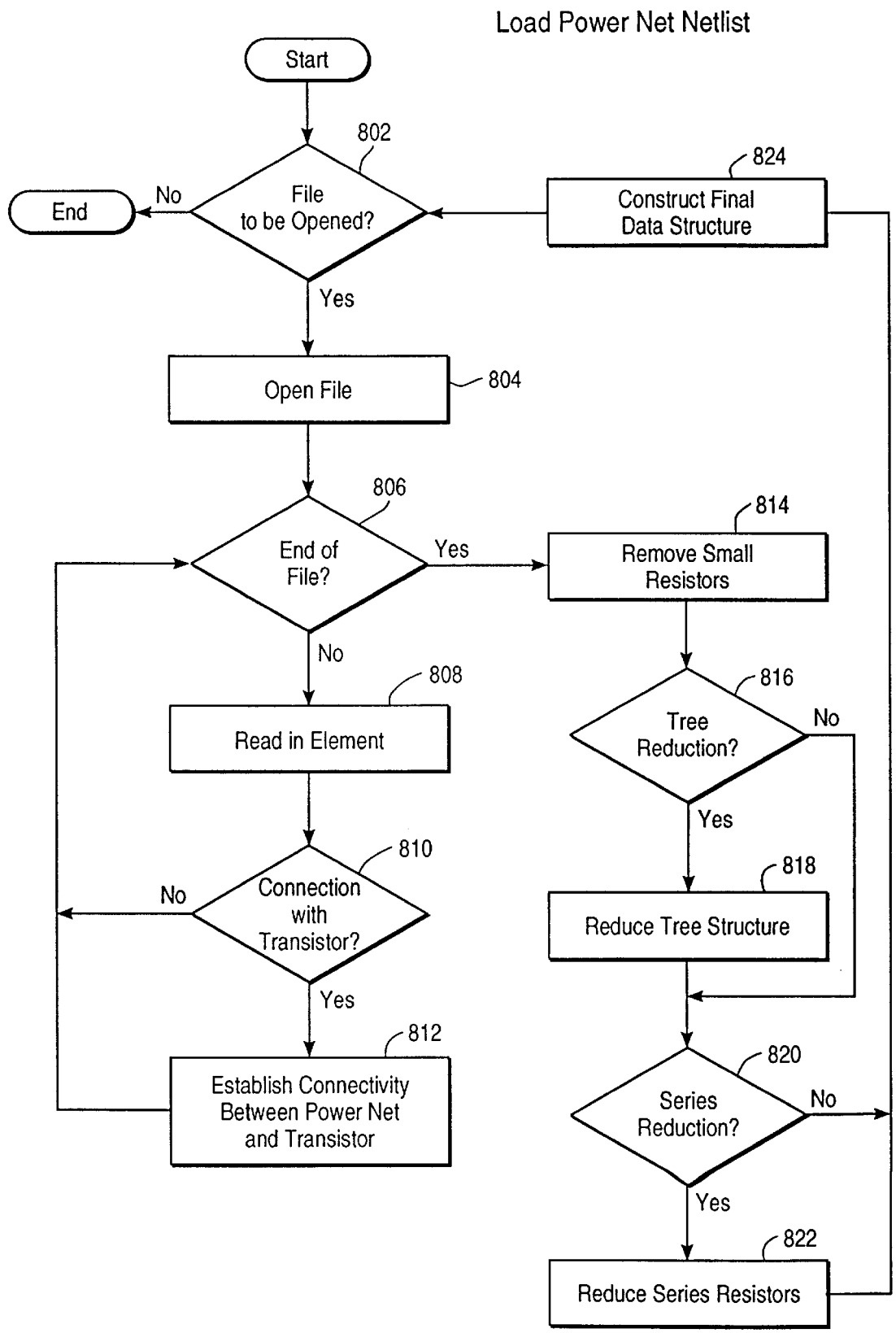
FIG. 8 is a flowchart of the process of loading the power net netlist.

FIG. 8 is a flowchart of the process of loading the power net netlist. At step 802, the system determines whether there is a file to be opened that contains a power net netlist. If a file exists that contains a power net netlist, the file is opened at step 804.

At step 806, the simulator determines whether the end of the file containing the netlist has been reached. If not, the simulator reads in an element of the power net netlist at step 808. If at step 810 the element is connected to a transistor, the simulator establishes a connection between the power net and the transistor at step 812.

Once the simulator reaches the end of the file at step 806, the simulator removes the small resistors in step 814. Small resistors are removed to improve simulation speed and reduce memory usage. In one embodiment, all resistors with resistance less than 0.1 milliohms is removed. The removal of the small resistors does not significantly effect the accuracy of the power net simulation.

Schematically, the power net resembles a tree that branches out from the power pad to different points of the transistor network. Methods may be utilized to reduce the size of the data structure for the power net. If in step 816 the user has specified tree reduction, the tree structure is reduced accordingly in step 818. Tree reduction removes subtrees from the power net data structure. The subtrees that are removed are still analyzed and the results utilized in analyzing the power net. If at step 820, the user has specified series reduction, series resistors are reduced by series reduction at step 822. Series reduction involves combining multiple resistors in series into a single resistor. At step 824, the final data structure of the power net is constructed. The power net simulation engine still keeps track of the layout information of eliminated resistors so that the results may be displayed on the power net layout. In one embodiment, the final data structure has a record for each node and resistor in the power net.

Figure 9:
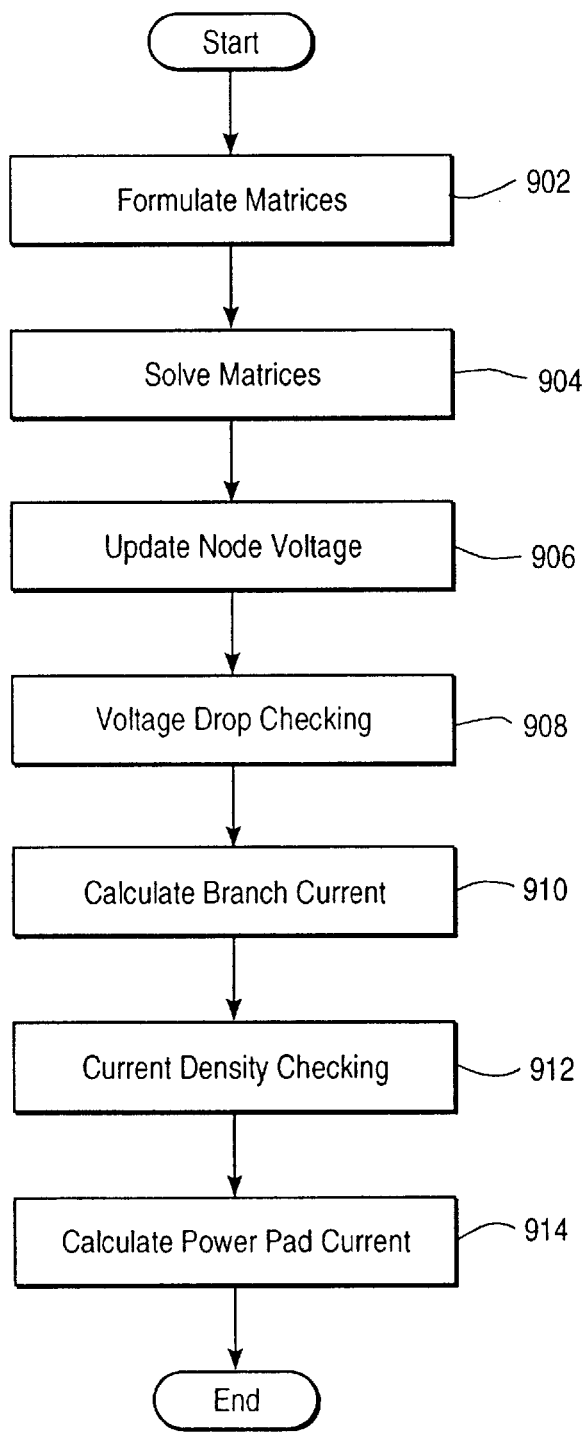
FIG. 9 is a flowchart of the process of power net simulation.

FIG. 9 is a flowchart of the process of power net simulation. The power net conceptually consists of multiple resistors which are connected at nodes (see FIG. 4). The resistors represent the resistance of a certain section of a metal line or a via between layers in the integrated circuit. In a preferred embodiment, Nodal Analysis is utilized to solve for the voltages at each node in the power net. To find the voltages, the following linear equation is solved:

$$A_{jj}V_j = I_j$$

where j is the number of nodes in the power net, A is a matrix containing conductance between nodes in the power net, V is matrix containing the voltage at each node, and I is a matrix containing the current at each node.

At step 902, the matrices are formulated. The formation of the matrix I loads the current values of the electronic devices connected to the power net into the matrix. These current values were calculated by the transistor network simulator. Matrix A is formulated with the conductance between nodes in the power net.

At step 904, the matrices are solved to calculate voltage for each node. Two commonly used techniques that may be used to solve the linear equation $A_{jj}V_j = I_j$ are Gaussian Elimination and LU decomposition. In a preferred embodiment, LU decomposition is utilized as it provides a performance advantage in that calculations on matrix A may be reused. As the matrices may be very large for large ICs, sparse matrix techniques known in the art may be utilized to take advantage of the fact that the matrices are relatively sparse. Sparse matrix techniques greatly reduce the memory usage and the computation time for large matrices. After the voltage for each node is calculated, the voltage at each node is updated at step 906.

At step 908, the voltage drop at each node is checked. The process of voltage drop checking will be described in more detail with reference to FIGS. 10 and 11.

At step 910, the branch current is calculated. The branch current is the current in each of the resistors in the power net. The current density at each resistor is checked at step 912. The process of current density checking will be described in more detail in reference to FIGS. 12 and 13. At step 914, the average, peak and RMS current for each power pad is calculated.

Figure 10:
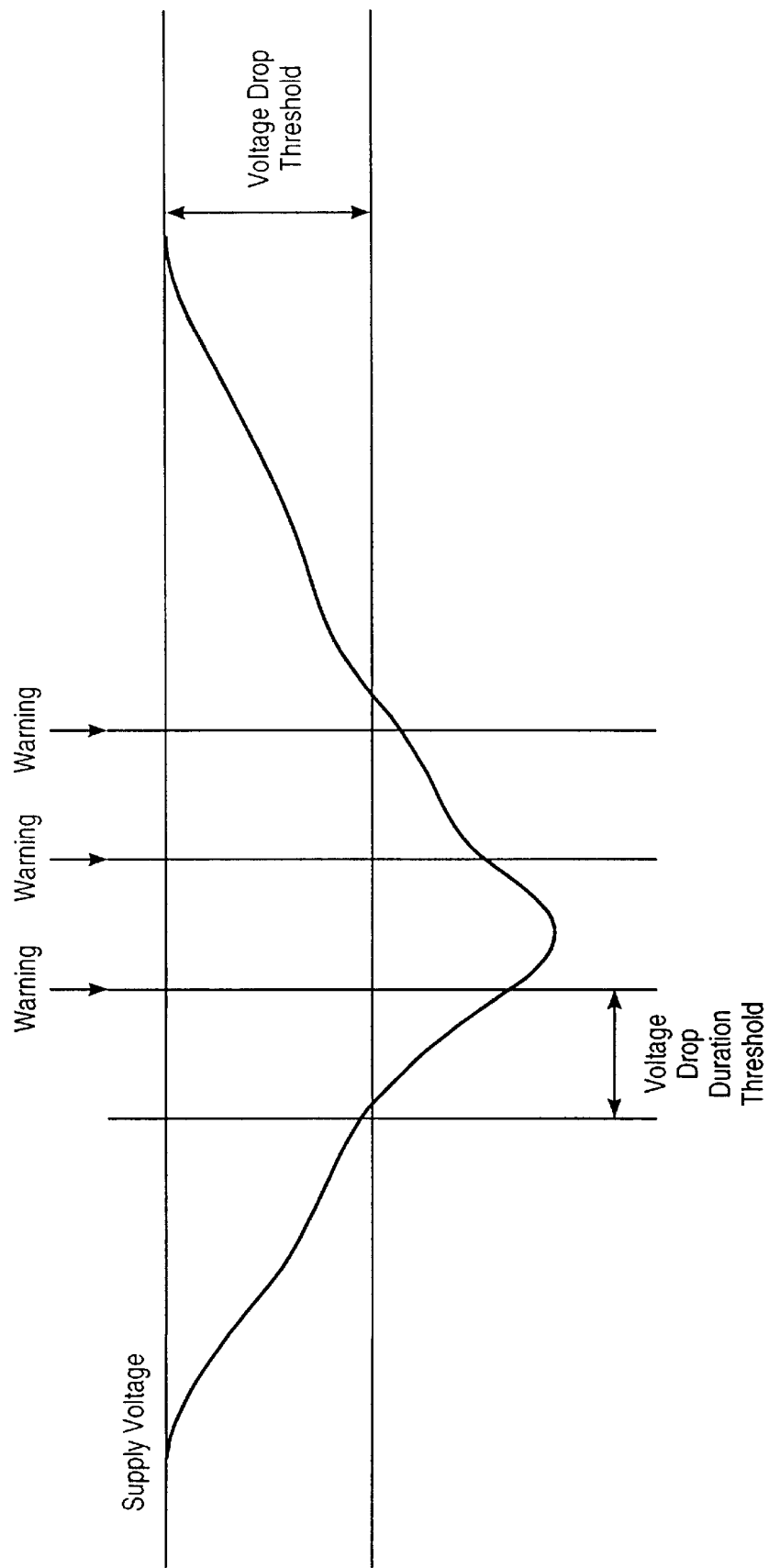
FIG. 10 is a graph illustrating voltage drop checking.

FIG. 10 is a graph illustrating voltage drop checking. As shown, when the supply voltage drops below a voltage drop threshold, a timer is started. If the voltage remains below the voltage drop threshold at the end of a specified amount of time, a voltage drop warning is produced. After a voltage drop warning is issued, the timer is reset. If, at the expiration of the timer, the supply voltage remains below the voltage drop threshold, another voltage drop warning will be issued.

Figure 11:
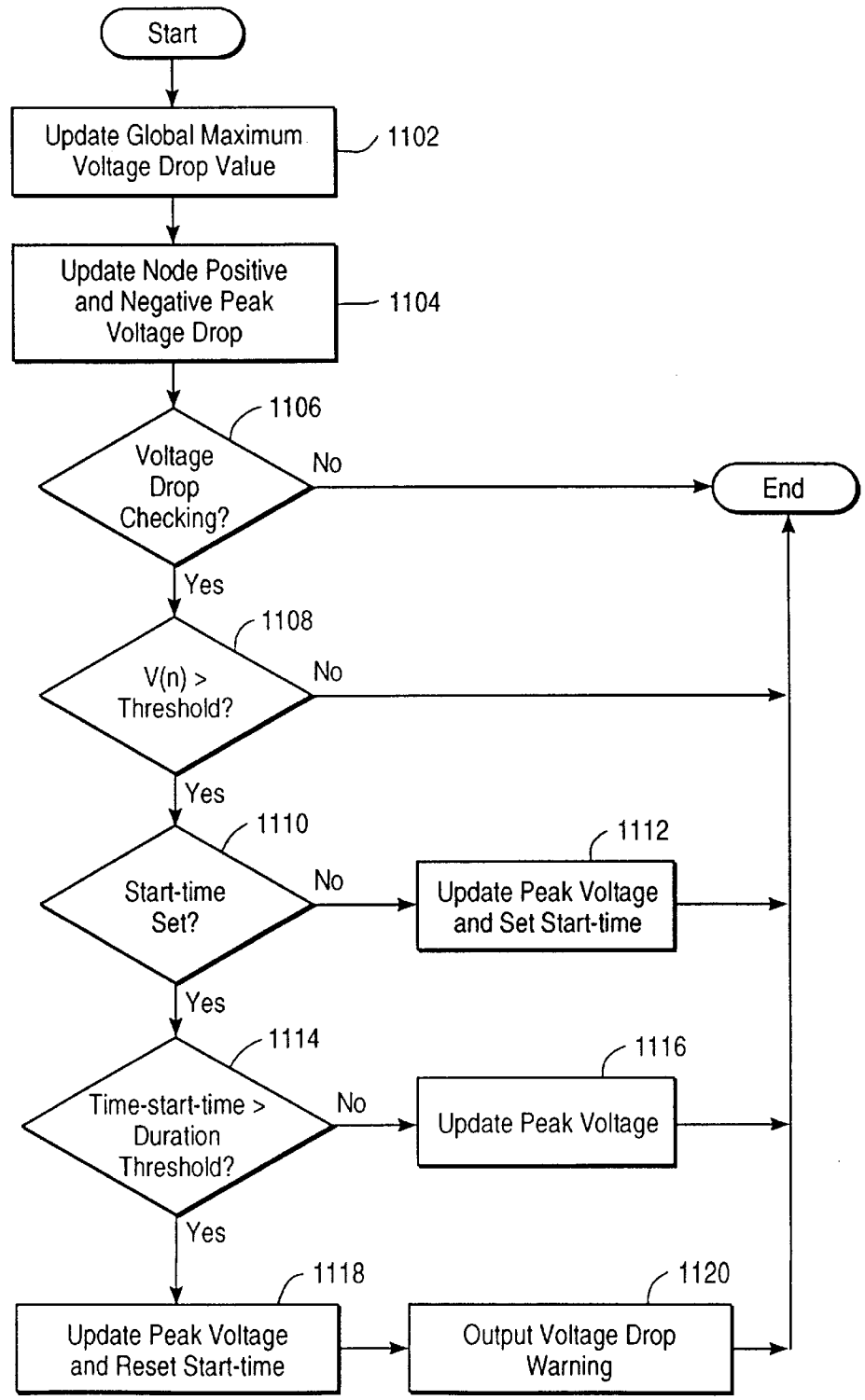
FIG. 11 is a flowchart of the process of voltage drop checking.

FIG. 11 is a flowchart of the process of voltage drop checking. The power net conceptually consists of multiple resistors which are connected at nodes. The process illustrated in FIG. 11 is performed for each node in the power net.

The Global Maximum Voltage Drop Value is updated at step 1102. The Global Maximum Voltage Drop Value represents the maximum voltage drop at any of the nodes in the power net during simulation. Typically, the farther a node is from a power pad, the larger the voltage drop. The increased voltage drop is caused by the longer metal lines and vias that provide resistance to the current flow. If the node has a voltage drop greater than the current Global Maximum Voltage Drop Value, the Global Maximum Voltage Drop Value is replaced by the voltage drop at the node. The Global Maximum Voltage Drop Value is utilized to produce the scale of voltage drops on the power net when displayed.

Figure 18:
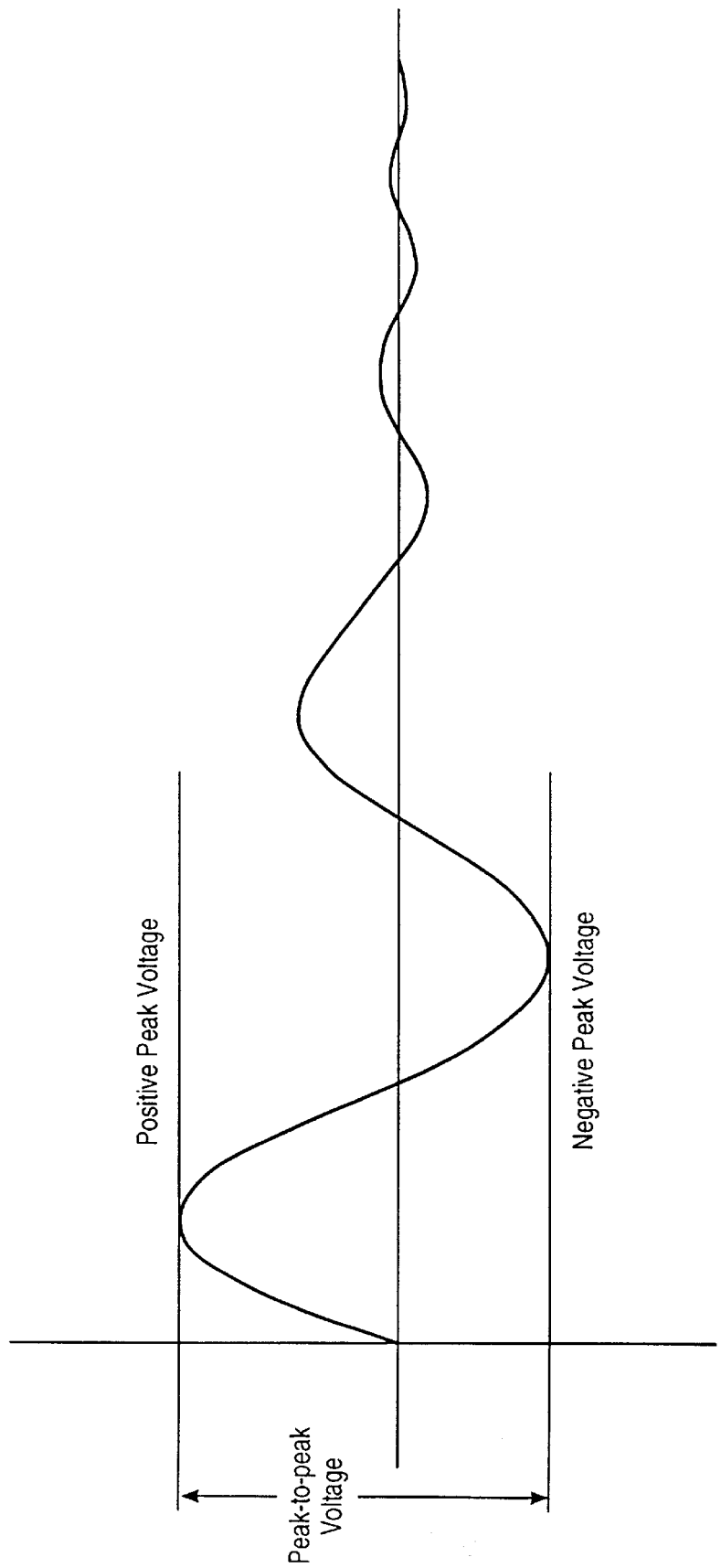
FIG. 18 is a graph illustrating ground bounce analysis.

The positive and negative peak voltage is updated for the node at step 1104. The positive and negative peak voltages are maintained throughout the simulation and are used for ground bounce analysis. FIG. 18 is a graph illustrating ground bounce analysis. In one embodiment, ground bounce is measured by the peak-to-peak voltage swing. As shown, a ground power supply swings from a positive peak voltage to a negative peak voltage. The peak-to-peak voltage is displayed and highlighted by the ChipViewer product for user analysis of the power net. At step 1106, the simulator checks to see if voltage drop checking for the nodes should be performed which is contained in the configuration file.

At step 1108, the voltage drop at the node is checked to see if it is greater than the user-defined voltage drop threshold. The user-defined voltage drop threshold is stored in the configuration file. If the voltage drop at the node is greater than the voltage drop threshold, a timer utilizing the variable start_time is checked to see if it has been set at step 1110. The variable start_time represents the event time at which the timer was set, with a null value indicating that the timer has not been set. If the timer has not been set, the node peak voltage is updated and the variable start_time is set to the current event time at step 1112.

If the timer utilizing the variable start_time has been set, a comparison is performed to see if a voltage drop duration threshold has been reached. The voltage drop duration threshold is stored in the configuration file and specifies the amount of time for which if the voltage drop at a node is greater than the voltage drop threshold, a warning will be output to the user. The current event time minus the variable start_time is compared to the voltage drop duration threshold. If the voltage drop duration threshold has not been reached, the node peak voltage is updated at step 1116.

If the voltage drop duration threshold has been reached, the node peak voltage is updated and the variable start_time is reset (i.e., set to a null value) at step 1118. A voltage drop warning is output to the user at step 1120. The voltage drop warning indicates to the user the node that had a voltage drop over the voltage drop threshold for a certain amount of time. Additionally, the warning includes other information like the peak voltage drop during the simulation segment. As there may be many voltage drop warnings, the warnings are written to a computer file so that the user may browse the file on the computer display or have it printed on a printer.

Figure 12:
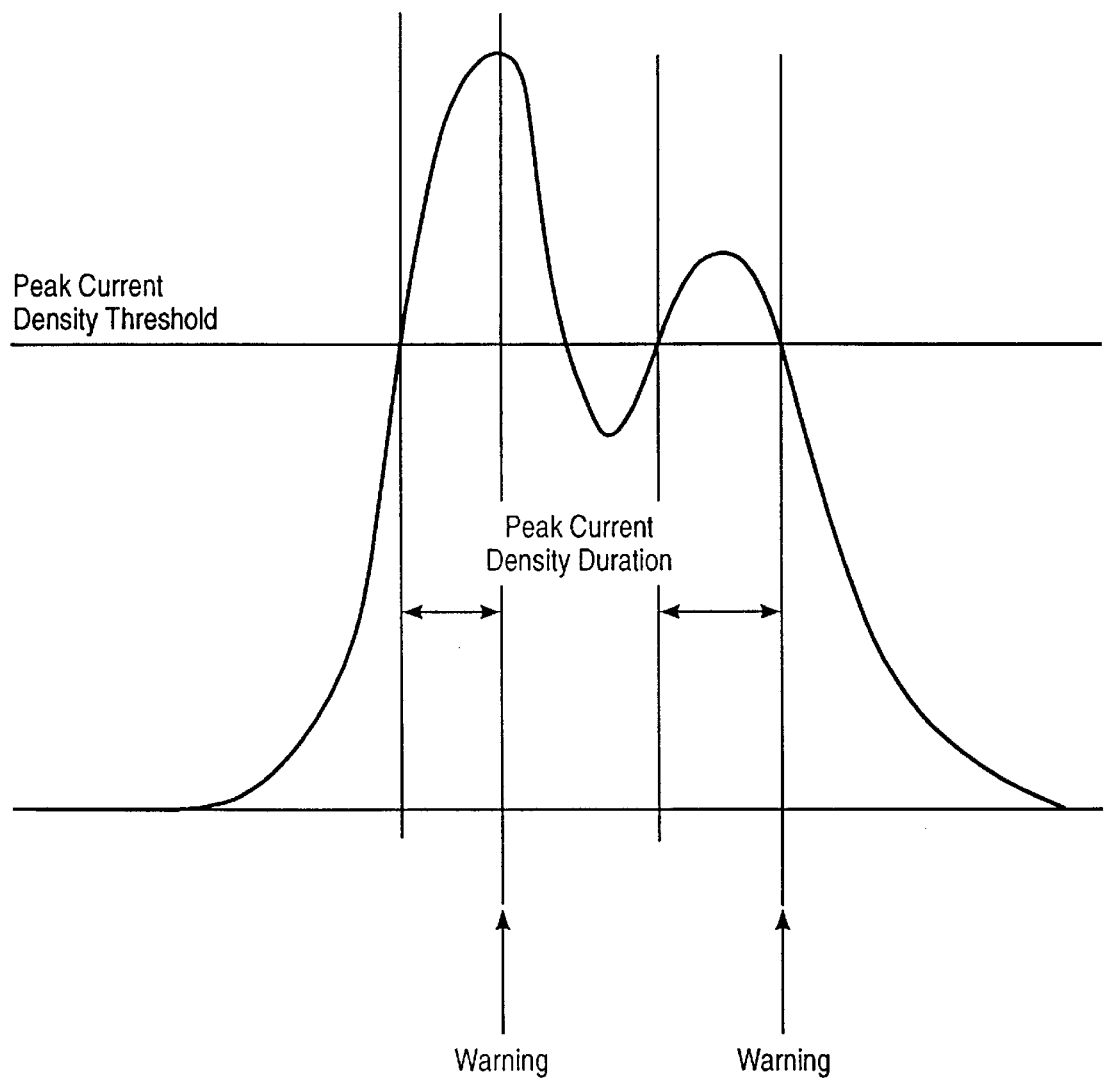
FIG. 12 is a graph illustrating current density checking.

FIG. 12 is a graph illustrating current density checking. As shown, when the peak current density rises above a peak current density threshold, a timer is started. If the peak current density remains above the peak current density threshold at the end of a specified amount of time, a peak current density warning is produced. After a peak current density warning is issued, the timer is reset.

Figure 13:
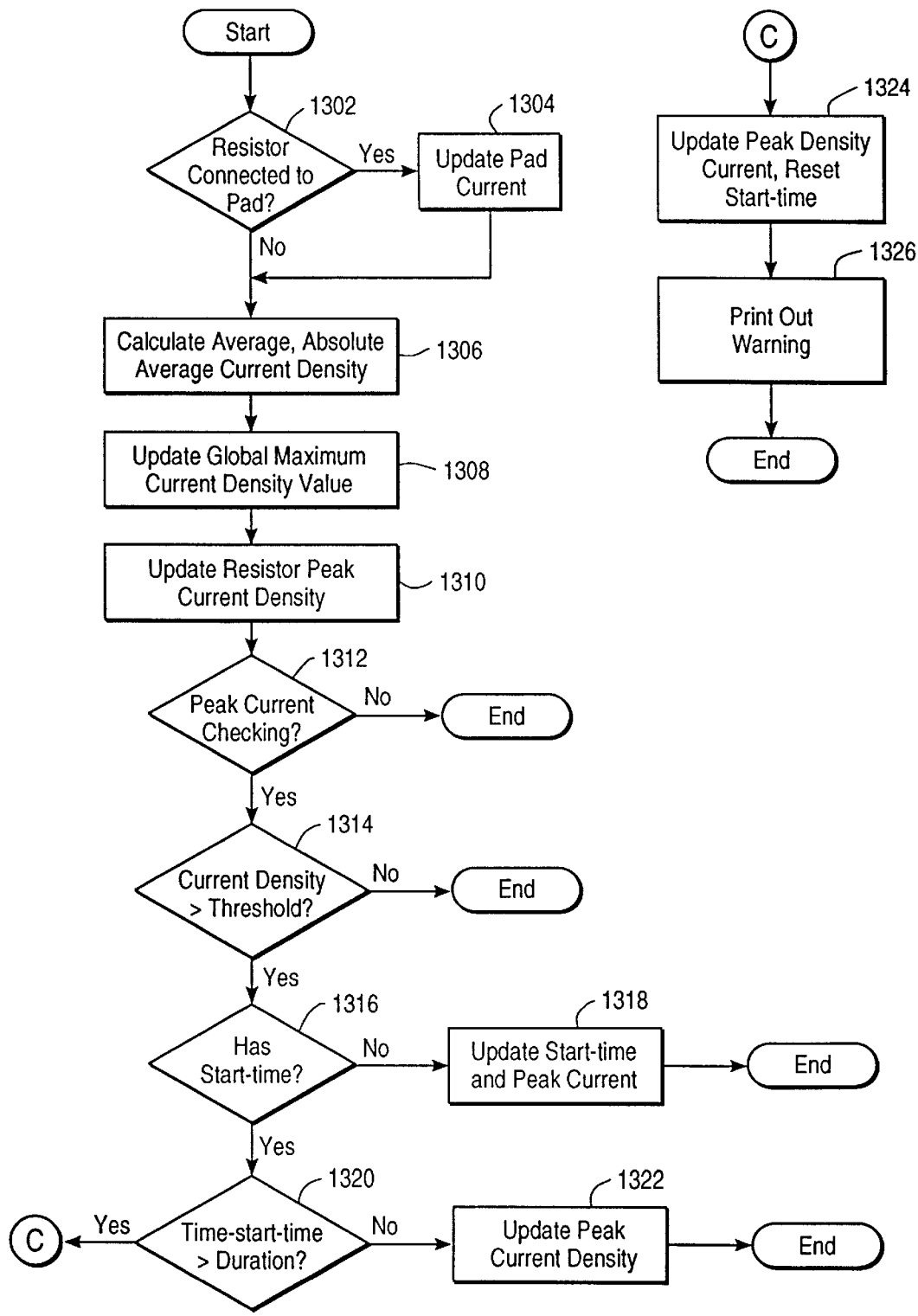
FIG. 13 is a flowchart of the process of current density checking.

FIG. 13 is a flowchart of the process of current density checking. The power net conceptually consists of multiple resistors which are connected at nodes. The process illustrated in FIG. 13 is performed for each resistor in the power net.

At step 1302, the simulator determines if the resistor is connected to a power pad. If the resistor is connected to a power pad, the power pad current is set equal to the sum of the current of the resistors connected to the pad at step 1304.

At step 1306, the average and absolute average current density for the resistor is calculated. The average and absolute average current density is both calculated because different electromigration calculations use one or the other. Although the default electromigration calculation uses the average current density, the user may define the electromigration calculation utilized.

The Global Maximum Current Density Value is updated at step 1308. The Global Maximum Current Density Value represents the maximum current density at any of the resistors in the power net during simulation. Typically, the current density increases the closer a resistor is to a power pad because more current is flowing through the metal line. If the resistor has a current density greater than the current Global Maximum Current Density Value, the Global Maximum Current Density Value is replaced by the current density at the resistor.

The peak current density is updated for the resistor at step 1310. At step 1312, the simulator checks to see if peak current checking for the resistors should be performed which is in the configuration file.

At step 1314, the current density at the resistor is checked to see if it is greater than the user-defined peak current density threshold. The user-defined peak current density threshold is stored in the configuration file. If the current density at the resistor is greater than the peak current density threshold, a timer utilizing the variable start_time is checked to see if it has been set at step 1316. As in voltage drop checking discussed in reference to FIG. 11, the variable start_time represents the event time at which the timer was set, with a null value indicating that the timer has not been set. If the timer has not been set, the resistor peak current density is updated and the variable start_time is set to the current event time at step 1318.

If the timer utilizing the variable start_time has been set, a comparison is performed to see if a peak current density duration threshold has been reached. The peak current density duration threshold is user-defined and stored in the configuration file. The peak current density duration threshold specifies the amount of time for which if the current density at a resistor is greater than the peak current density threshold, a warning will be output to the user. The current event time minus the variable start_time is compared to the peak current density duration threshold. If the peak current density duration threshold has not been reached, the resistor peak current density is updated at step 1322.

If the peak current density duration threshold has been reached, the resistor peak current density is updated and the variable start_time is reset (i.e., set to a null value) at step 1324. A current density warning is output to the user at step 1326. The current density warning indicates to the user the resistor that had a current density over the peak current density threshold for a certain amount of time. Additionally, the warning includes other information like the peak current density during the simulation segment. As there may be many current density warnings, the warnings are written to a computer file so that the user may browse the file on the computer display or have it printed on a printer.

Display of the Power Net

As briefly described in reference to FIG. 1, the present invention provides a ChipViewer product that displays power net characteristics to the user. The characteristics are determined by the power net simulator. Additionally, the ChipViewer product provides a graphical user interface to ARCADIA files.

Figure 14A:
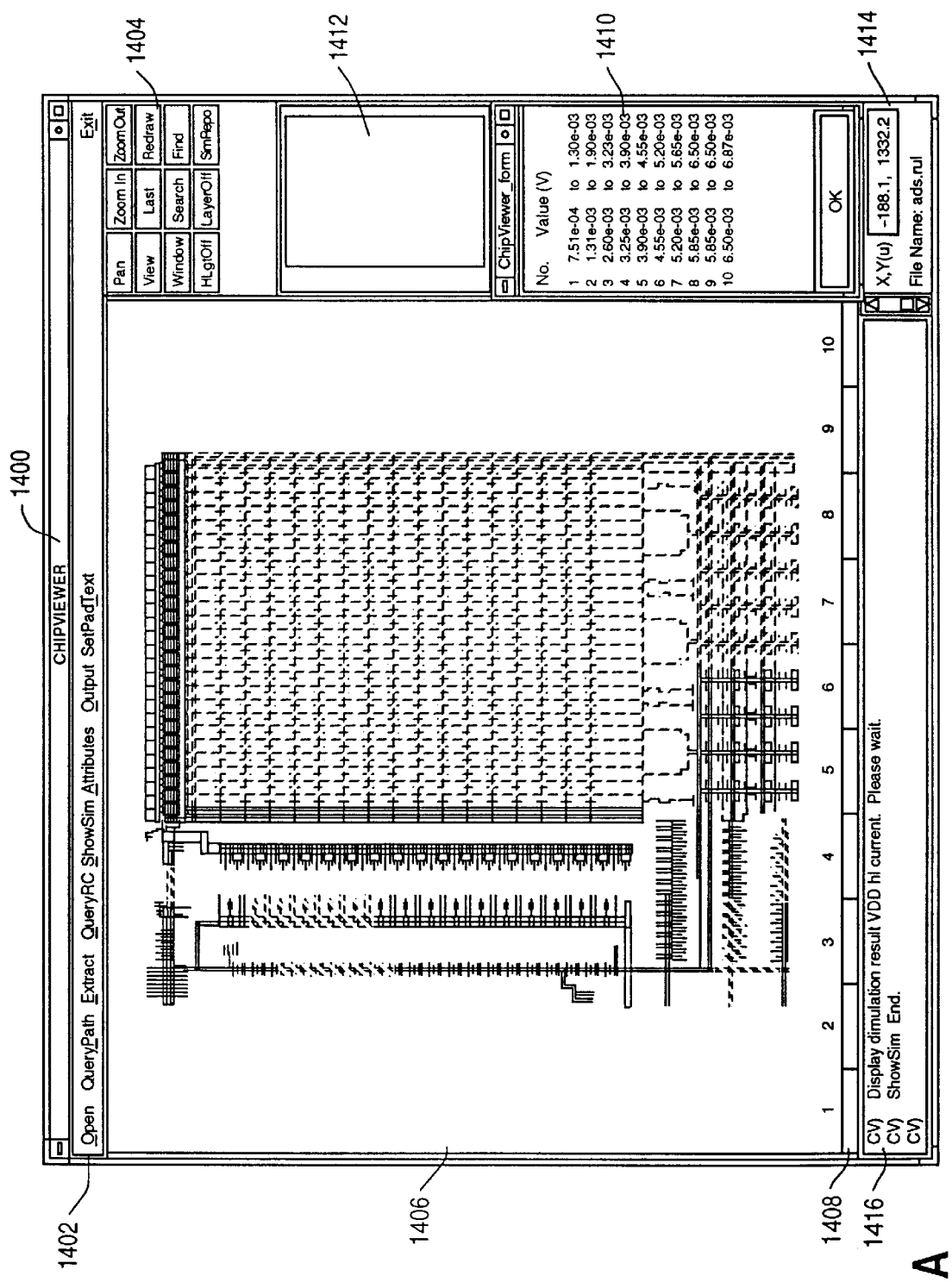
FIGS. 14a and 14b show a computer display of the voltage drop and current density characteristics of a power net, respectively.

FIG. 14a shows a computer display of the voltage drop characteristics of a power net. A display 1400 is windows oriented so that the user may easily view different aspects of the power net. The display includes an operations menu 1402 which provides functions to the user utilizing drop down menus. Display buttons 1404 allow the user to select the view of a chip layout display window 1406. The chip layout display window shown is a power net with different colors representing different ranges of voltage drop.

A color bar 1408 shows each color in ascending range order with a color number. For example, the color bar allows a user to quickly identify which portions of the power net have a voltage drop in the highest ranges. Additionally, a range window 1410 shows the actual voltage drop range for each color number in a table. Thus, the user can easily identify precisely what voltage drop range each color number represents.

A reference window 1412 shows the proportion and location of the chip layout currently displayed in the chip layout display window. As shown, the whole chip layout is currently being displayed in the chip layout display window. If a user utilized the zoom in button of display buttons 1404, a rectangle would appear in the reference window to indicate the portion of the chip layout currently being displayed in the chip layout display window.

A status window 1414 shows the current cursor coordinates and the current filename being accessed. Lastly, a console window 1416 is for system message display.

The power net shown in FIG. 14a has two power pads—one at the top left corner and one at the bottom left corner. A user is able to quickly identify areas of the IC that have the highest voltage drop which may lead to inaccurate operation of the IC. If a problem is detected, an IC designer may then modify the power net and rerun the power net simulator to determine whether the problem is fixed.

Figure 14B:
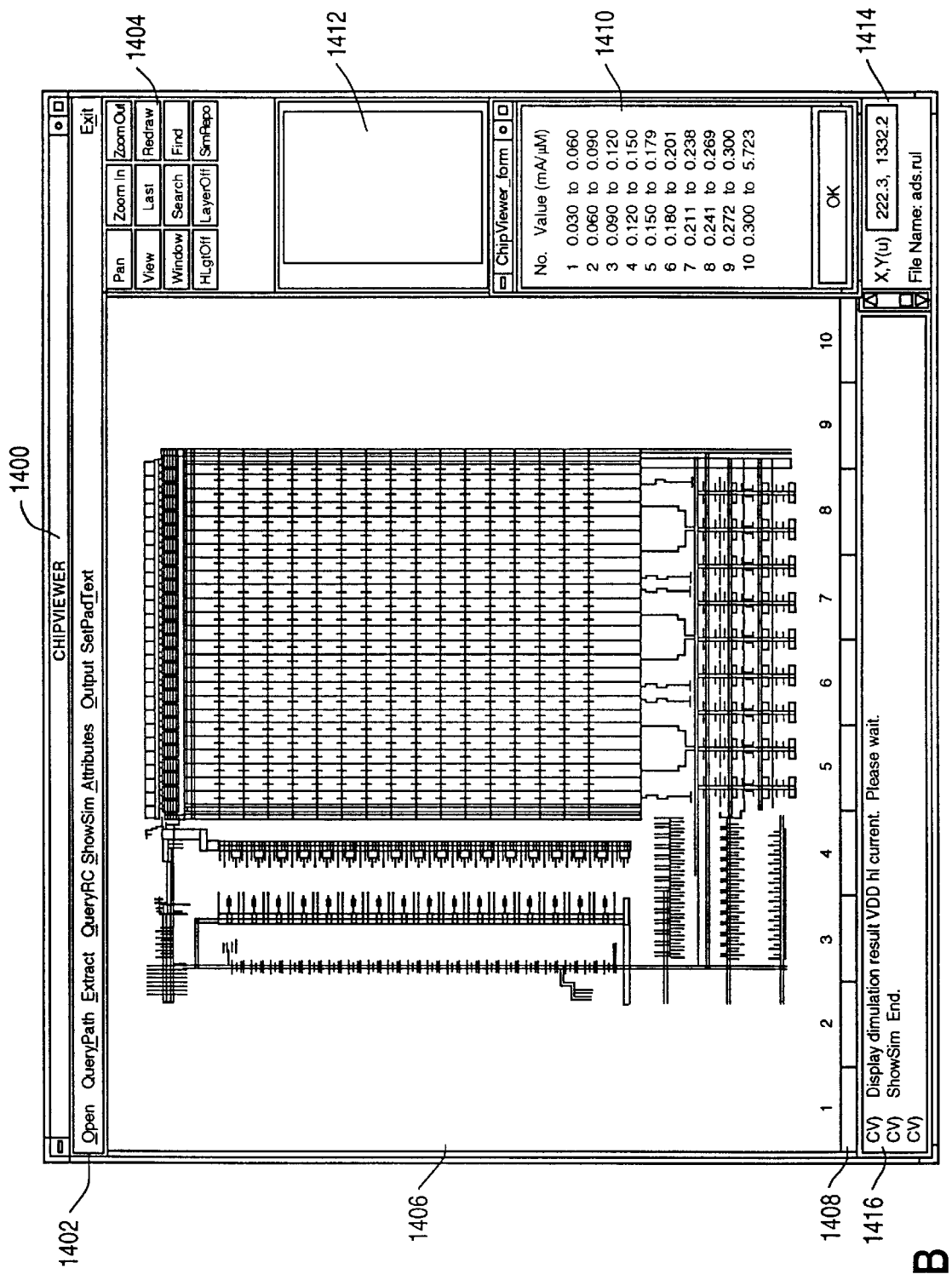

FIG. 14b shows a computer display of the current density characteristics of a power net. As before, the power net shown has two power pads—one at the top left corner and one at the bottom left corner. A user is able to quickly identify areas of the IC that have the highest current density which may lead to electromigration problems. If a problem is detected, an IC designer may then modify the power net and rerun the power net simulator to determine whether the problem is fixed.

During simulation, highlight computer files are created which are read by the ChipViewer product. The ChipViewer product utilizes the highlight files in conjunction with the extracted power net netlist file to display characteristics of the power net. A highlight file may contain information about the voltage drop or current density characteristics of the power net. An example of a highlight file is as follows:

unit (mA/$\mu$M)
group 6484 color 5 value 0.014803 R1
group 6486 color 1 value 0.002308 R2
. . .

The first line specifies the units, which in the example above indicates that the information concerns current density. The second line specifies a resistor with group index 6484, highlight level 5, current density 0.014803 mA/$\mu$M, and name R1. Information like voltage drop is stored in separate files. Power density may be roughly calculated using the current values.

Figure 15:
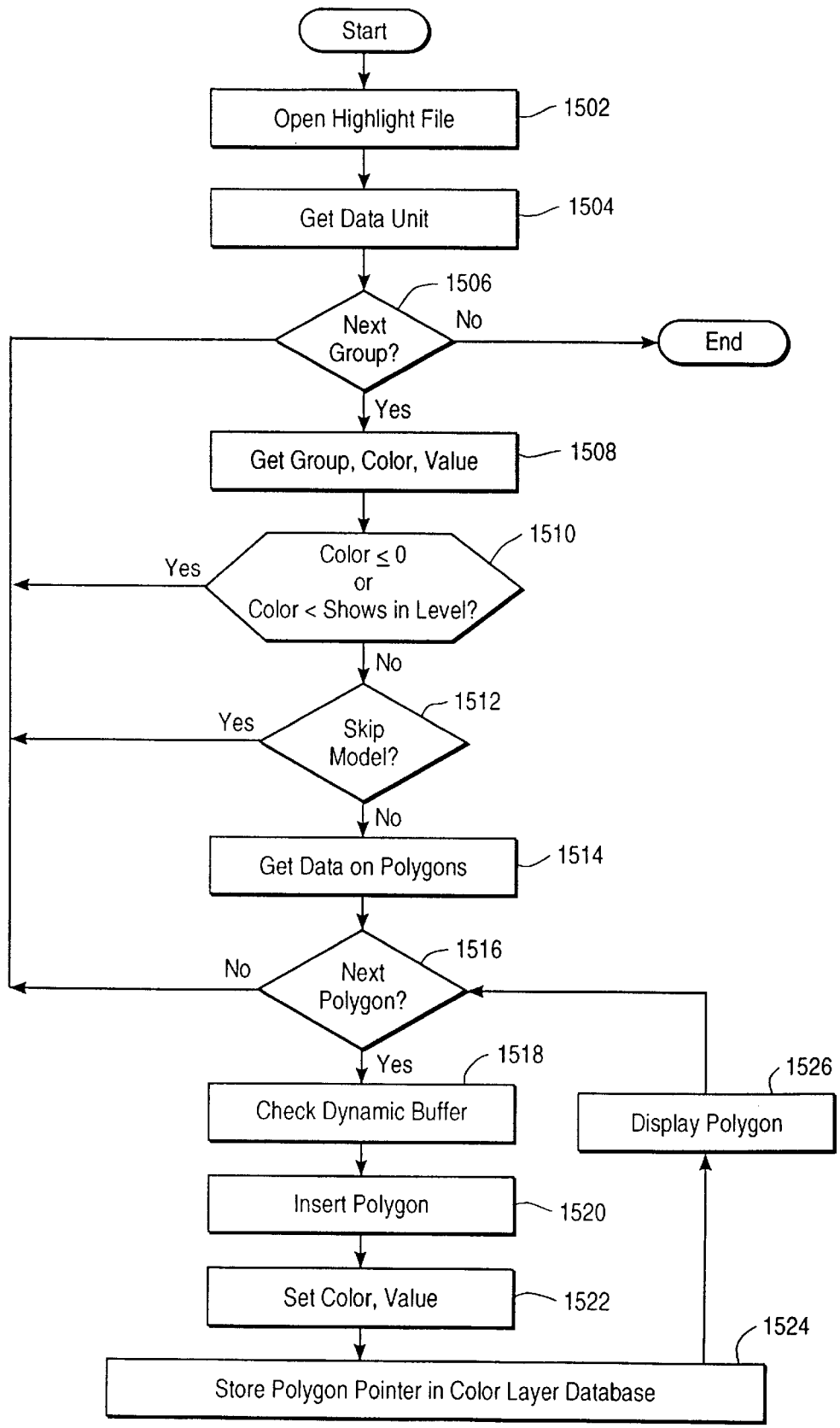
FIG. 15 is a flowchart of the process of displaying the characteristics of a power net.

FIG. 15 is a flowchart of the process of displaying the characteristics of a power net. At step 1502, a highlight file is opened. After the highlight file is opened, the units of the data in the highlight file are read in step 1504. An example of units for a highlight file are mA/∞M for current density.

After the data units in the highlight file are one or more groups. A group may include one or more resistor and more than polygon. A polygon is portion of the circuit layout that is created during RC extraction for better accuracy of the RC values. In a preferred embodiment, the ARCADIA system performs the extraction and creates the groups; however, other extraction programs may be utilized.

If there is another group in the highlight file, the group number, color and value are read at step 1508. The user can use the resistor name to locate specific resistors in the power net. At step 1510, the group color is checked to see if it should be displayed. The variable ShowSimLevel is a user-defined value that specifies that the system only display groups with color values equal to or greater than the value. For example, if the user specified a ShowSimLevel of 8, only groups with color number 7 or higher would be displayed. Thus, the group color must be greater than or equal to zero or greater than the ShowSimLevel to be displayed.

At step 1512, the system checks if this group should be skipped and not displayed. In one embodiment, the user is able to specify when displaying voltage drop on the power net that certain areas of the power net should not be displayed. To speed up display of the voltage drop, a percentage of the groups of each color are not displayed. The percentage may be calculated by the equation 1/(n+1) where n is the color value from 1 to 10. For example, 50% of the groups will be skipped for color 1 and 33% for color 2. In a preferred embodiment, only groups with color numbers less than or equal to 8 are skipped. This method speed up display and yet retains the graduated profile for voltage drop analysis. For current density analysis, the speed of the display is typically not a problem.

At step 1514, the system retrieves data on all the polygons of the group. The polygon data is contained in the extracted power net netlist. Once the system reads in the data on all the polygons of the group, the system loops through the polygons.

The system checks to see if there is another polygon for the group at step 1516. If there is another polygon for the group, the system checks a dynamic buffer at step 1518. The dynamic buffer stores the polygon data and is checked to see if it is large enough to hold all the polygons. Otherwise, more memory space is allocated to the dynamic buffer. The system then inserts the polygon into the dynamic buffer at step 1528. At step 1522, the color and value of the polygon is set.

The system maintains a color layer database. The color layer database contains pointers to the polygons stored in the dynamic buffer. The use of the color layer database makes data access faster and more flexible. At step 1524, the polygon pointer is stored in the color layer database. The polygon is displayed at step 1526.

Figure 16:
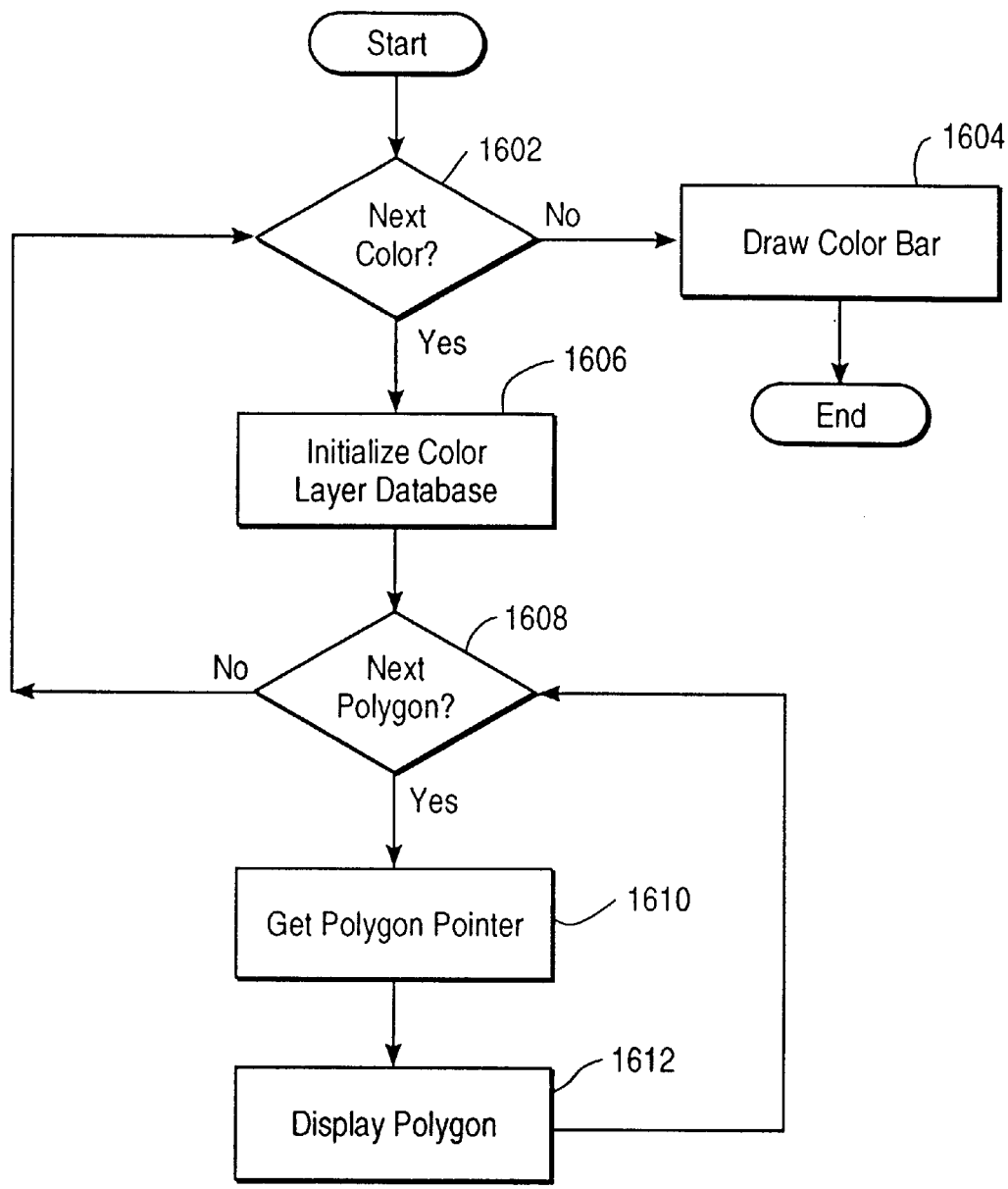
FIG. 16 is a flowchart of the process of redisplaying the characteristics of a power net.

FIG. 16 is a flowchart of the process of redisplaying the characteristics of a power net. In a preferred embodiment the color bar includes ten colors. When the characteristics of a power net are redisplayed, the system loops through each of these ten colors. At step 1602, the system checks to see if there is another color in the color bar to be displayed. If not, the system displays color bar 1408 under chip layout display window 1406.

At step 1606, the color layer database is initialized for accessing a color. Each color layer may include zero or more polygons that will be displayed in color. The system checks to see if there is another polygon for the current color at step 1608.

If there is another polygon for the current color, the system gets the polygon pointer at step 1610. The polygon pointer points to the data structure for the polygon stored in the dynamic buffer. At step 1612, the polygon is displayed.

Figure 17:
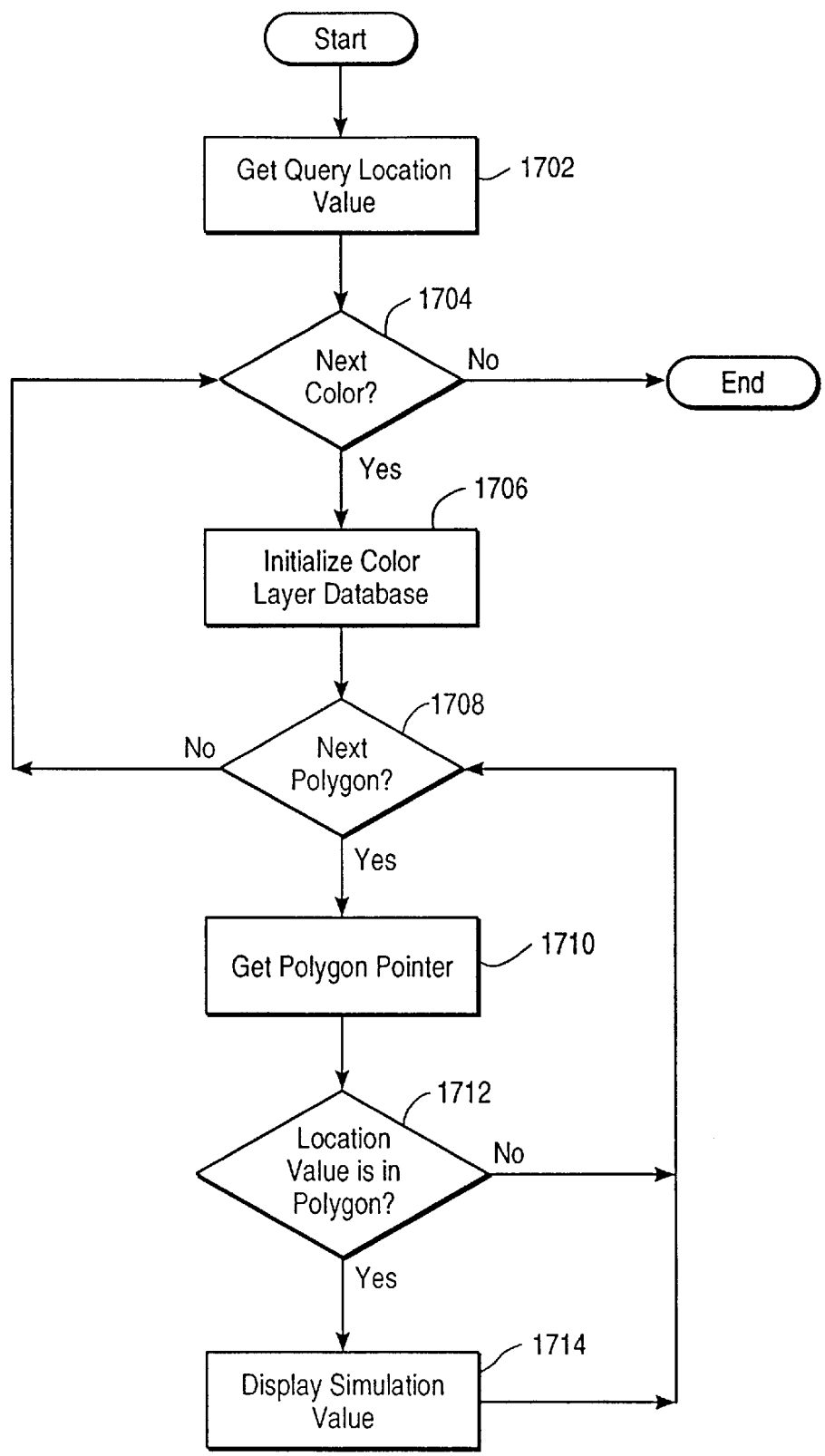
FIG. 17 is a flowchart of the process of responding to a user query for the specific simulation value of a characteristic of a power net.

FIG. 17 is a flowchart of the process of responding to a user query for the specific simulation value of a characteristic of a power net. At step 1702, the system gets the query location value. The query location value is the x and y coordinates of interest for the user. The user can just "click" on the area with an input device (e.g., mouse).

At step 1704, the system checks to see if there is another color in the color bar to loop through. If there is, the system initializes the color layer database at step 1706. Each color layer may include zero or more polygons. The system checks to see if there is another polygon for the current color at step 1708.

If there is another polygon for the current color, the system gets the polygon pointer at step 1710. The system uses the polygon pointer to determine if the polygon is at the location specified by the user. At step 1712, the system checks if the location value is within the polygon. If the location value is within the polygon, the system uses the polygon pointer to access the specific simulation value requested by the user. At step 1714, the simulation value is displayed.

Conclusion

One embodiment of the invention is implemented in software which runs on a UNIX™-based engineering workstation, as discussed above. A "C" language source code listing for this embodiment is provided in an appendix. The appendix contains source code from the files main.c, emparse.c, em.c, queryvalue.c, redisplay.c, and showsim.c, available in the present application.

The invention has now been described in terms of a preferred embodiment. Modification and substitutions will now be apparent to persons of ordinary skill in the art.

Accordingly, it is not intended that the invention be limited except as provided by the appended claims. Appendix is available in the file.

What is claimed is:

1. A method of analyzing power nets of a integrated circuit using a computer system comprising:

receiving a circuit layout of an integrated circuit having circuit elements;

creating a circuit net list from the circuit layout;

creating a power net netlist from information in the circuit netlist, the power net netlist having a power pad connected to at least one of the circuit elements;

simulating operation of the integrated circuit using the circuit netlist for generating current information for at least one of the circuit elements connected to a power net defined by the power net netlist; and simulating operation of the power net using the current information for determining a charateristic relating to a portion of the power net.

2. The method of claim 1 further comprising comparing the circuit layout to the circuit netlist for discrepancies in the crcuit interconnections.

3. The method of claim 1, wherein the simulating operation of the integrated circuit includes applying an input to the integrated circuit.

4. The method of claim 1, wherein the input is selected from a group consisting of a test vector, a clock signal, and logical one and zero constants.

5. The method of claim 1, wherein the simulating operation of the integrated circuit includes applying power supply voltages to the integrated circuit.

6. The method of claim 1, wherein the power net netlist is generated using a power net.

7. The method of claim 1 further comprising checking the circuit interconnections in the circuit layout by extracting parameters from the circuit netlist.

8. The method of claim 1, wherein the characteristic is selected from a group consisting of voltage drop, current density, electromigration, and ground bounce.

9. The method of claim 1 further comprising displaying a layout of the power net on a display of the computer system.

10. The method of claim 9, wherein the display shows the voltage drop and the current density ofthe portion of the power net.

11. The method of claim 1, wherein the simulating operation of the power net includes calculating a voltage drop at a node in the power net.

12. The method of claim 1, wherein the simulating operaton of the power net includes determining if the voltage drop is greater than a voltage drop threshold.

13. A system for analyzing a plurality of power nets of an integrated circuit, comprising:

a power net extractor configured to create a power net netlist from the plurality of power nets of the integrated circuit;

a circuit simulator coupled to the power net extractor, the circuit simulator configured to produce simulation information by generating a cut through a circuit element in the integrated circuit; and a power net simulator coupled to the circuit simulator, the power net simulator configured to utilize the simulation information to determine a characteristic of a portion of the integrated circuit.

14. The system of claim 13, a display coupled to the power net simulator, the display configured to display the characteristic of the portion of the integrated circuit.

15. The system of claim 13, wherein the characteristic is selected from a group consisting of voltage drop, current density, electromigration, and ground bounce.

16. The system of claim 13, wherein the circwt simulator determines average current through the circuit element in the integrated circuit.

17. The system of claim 13, wherein the circuit simulator is configured to use power supply voltages.

18. The system of claim 13, herein the power net simulator is configured to read simulation information from the power net netlist.

19. The system of claim 13, wherein the power net simulator is configured to remove resistance values of less than 0.1 milliohms from the power net netlist.

20. A computer readable media containing program code for implementing a method of simulating power nets of an integrated circuit, the computer readable media comprising:

code for receiving a circuit layout of an integrated circuit having circuit elements;

code for creating a circuit netlist from the circuit layout;

code for creating a power net netlist from information in the circuit netlist, the power net netlist having a power pad connected to at least one of the circuit elements;

code for simulating operation of the integrated circuit using the circuit netlist for generating current information for at least one of the circuit elements connected to a power net defined by the power net netlist; and code for simulating operation of the power net using the current information for determining a characteristic relating to a portion of the power net.

* * * * *